United States Patent
Senda et al.

(10) Patent No.: US 6,738,949 B2
(45) Date of Patent: May 18, 2004

(54) ERROR CORRECTION CIRCUIT AND ERROR CORRECTION METHOD

(75) Inventors: Hiroyuki Senda, Osaka (JP); Akira Kisoda, Moriguchi (JP); Takehiro Kamada, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 6 days.

(21) Appl. No.: 09/311,394

(22) Filed: May 13, 1999

(65) Prior Publication Data

US 2002/0152441 A1 Oct. 17, 2002

(30) Foreign Application Priority Data

May 13, 1998 (JP) ............................ 10-150533
Jul. 16, 1998 (JP) ............................ 10-202364

(51) Int. Cl.[7] ................. H03M 13/03; H04L 23/02; H04L 5/12
(52) U.S. Cl. ................. 714/796; 714/792; 375/265
(58) Field of Search ................. 714/792, 796; 375/265

(56) References Cited

U.S. PATENT DOCUMENTS

| | | | | |
|---|---|---|---|---|
| 4,669,084 A | * | 5/1987 | Hartman et al. ............ 714/786 |
| 4,730,322 A | * | 3/1988 | Pollara-Bozzola .......... 714/792 |
| 4,868,830 A | * | 9/1989 | Pollara-Bozzola .......... 714/794 |
| 4,905,317 A | * | 2/1990 | Suzuki et al. ............... 341/51 |
| 5,379,306 A | * | 1/1995 | Noma et al. ................ 714/792 |
| 5,408,502 A | * | 4/1995 | How .......................... 375/340 |
| 5,502,736 A | * | 3/1996 | Todoroki ..................... 714/795 |
| 5,651,032 A | * | 7/1997 | Okita .......................... 375/341 |
| 5,740,203 A | * | 4/1998 | Ramaswamy et al. ...... 375/341 |
| 5,757,834 A | * | 5/1998 | Fang et al. .................. 714/789 |
| 5,844,922 A | * | 12/1998 | Wolf et al. .................. 714/786 |
| 5,944,850 A | * | 8/1999 | Chouly et al. ............... 714/790 |
| 5,974,091 A | * | 10/1999 | Huff ............................ 375/265 |
| 5,991,341 A | * | 11/1999 | Shin ............................ 375/265 |
| 5,996,112 A | * | 11/1999 | Dabiri et al. ............... 714/795 |
| 6,016,568 A | * | 1/2000 | Wolf et al. .................. 714/792 |

(List continued on next page.)

FOREIGN PATENT DOCUMENTS

| | | |
|---|---|---|
| JP | 08-023282 | 1/1996 |
| JP | 09/147493 | 6/1997 |
| JP | 10-042289 | 2/1998 |
| JP | 10-294671 | 11/1998 |
| JP | 10-322229 | 12/1998 |
| JP | 2000-031870 | 1/2000 |

OTHER PUBLICATIONS

S. H. Leung and Jin Xin, "Asymmetric trellis coded modulation (ATCM)", This paper appears in: Singapore ICCS/ISITA '92. 'Communications on the Move', On pp. 784–788, vol. 2, Nov. 16–20, 1992.*

Primary Examiner—Albert Decady
Assistant Examiner—Joseph D. Torres
(74) Attorney, Agent, or Firm—RatnerPrestia

(57) ABSTRACT

The present invention provides an error correction circuit for receiving and decoding a trellis-encoded signal of a series of data $Z_q, Z_{q-1}, \ldots, Z_1$ which comprises convolutional-encoded bits and unencoded bits, the convolutional-encoded bits being obtained by convolutional-encoding lower t bits $X_t, X_{t-1}, \ldots, X_1$ of an input p-bit series of data $X_p, X_{p-1}, \ldots, X_1$ (where $p \geq 2$, $q \geq p$, and $p > t \geq 1$), and the unencoded bits being obtained by not convolutional-encoding upper (p-t) bits thereof. The circuit includes: a maximum likelihood decoder for preselecting one of m parallel paths of transition from state x at time k to state y at time k+1.

12 Claims, 37 Drawing Sheets

U.S. PATENT DOCUMENTS

| | | | |
|---|---|---|---|
| 6,034,997 A | * 3/2000 | Mackenthun | 375/265 |
| 6,041,432 A | * 3/2000 | Ikeda | 714/786 |
| 6,094,739 A | * 7/2000 | Miller et al. | 714/792 |
| 6,131,180 A | * 10/2000 | Ramesh | 714/790 |
| 6,178,209 B1 | * 1/2001 | Hulyalkar et al. | 375/341 |
| 6,233,289 B1 | * 5/2001 | Fredrickson | 375/341 |
| 6,269,129 B1 | * 7/2001 | Rhee et al. | 375/341 |
| 6,385,258 B1 | * 5/2002 | Ooya et al. | 375/341 |
| 6,411,663 B1 | * 6/2002 | Abe | 375/341 |
| 6,421,395 B1 | * 7/2002 | Wei | 375/265 |

* cited by examiner

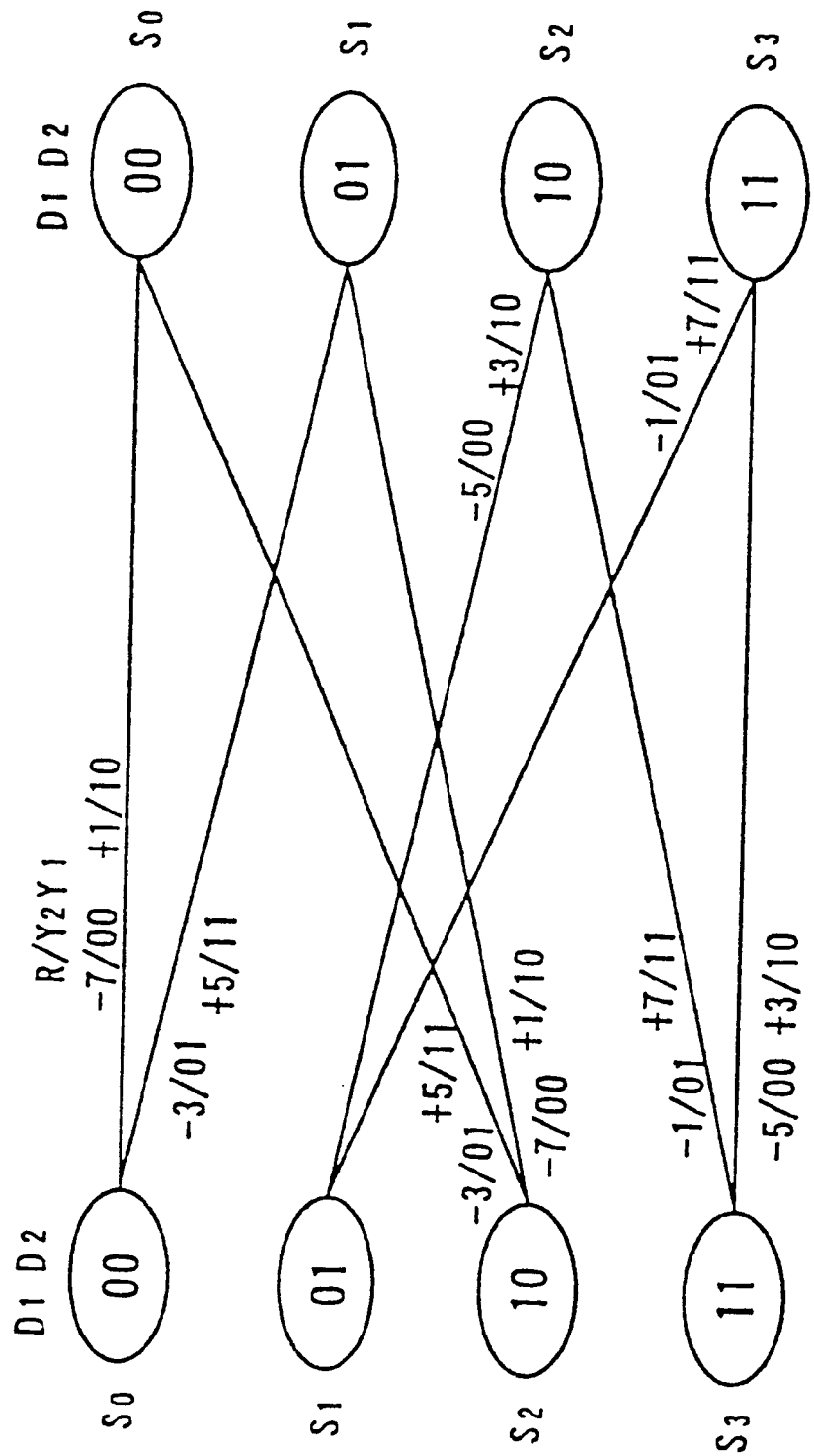
FIG. 7  4-state transition diagram

FIG. 8A

| X₂ | D₅ D₄ | Y₂ Z₂ | Z₃ | W₃ | W₂ | Level |
|---|---|---|---|---|---|---|
| 1 | 0 | 1 | 1 | 0 | 1 | 8,10,12,14 |
| 0 | 0 | 0 | 1 | 0 | 0 | 0,2,4,6 |
| 0 | 1 | 1 | 1 | 0 | 0 | 0,2,4,6 |
| 1 | 0 | 1 | 0 | 0 | 0 | 0,2,4,6 |
| 0 | 0 | 0 | 0 | 1 | 1 | −8,−6,−4,−2 |
| 0 | 1 | 1 | 0 | 1 | 1 | −8,−6,−4,−2 |
| 1 | 1 | 0 | 1 | 1 | 1 | −8,−6,−4,−2 |
| 1 | 1 | 0 | 0 | 1 | 0 | −14,−12,−10 |

FIG. 8B

| Y₁ X₁ | Z₃ | W₁ | W₀ | Level |
|---|---|---|---|---|
| 1 | 1 | 0 | 0 | −8,0,8 |
| 0 | 1 | 0 | 0 | −8,0,8 |
| 0 | 0 | 0 | 1 | −14,−6,2,10 |
| 1 | 1 | 0 | 1 | −14,−6,2,10 |
| 0 | 1 | 0 | 1 | −14,−6,2,10 |
| 0 | 0 | 1 | 0 | −12,−4,4,12 |
| 1 | 1 | 1 | 0 | −12,−4,4,12 |
| 1 | 0 | 1 | 1 | −10,−2,6,14 |
| 0 | 0 | 1 | 1 | −10,−2,6,14 |
| 1 | 1 | 1 | 1 | −10,−2,6,14 |

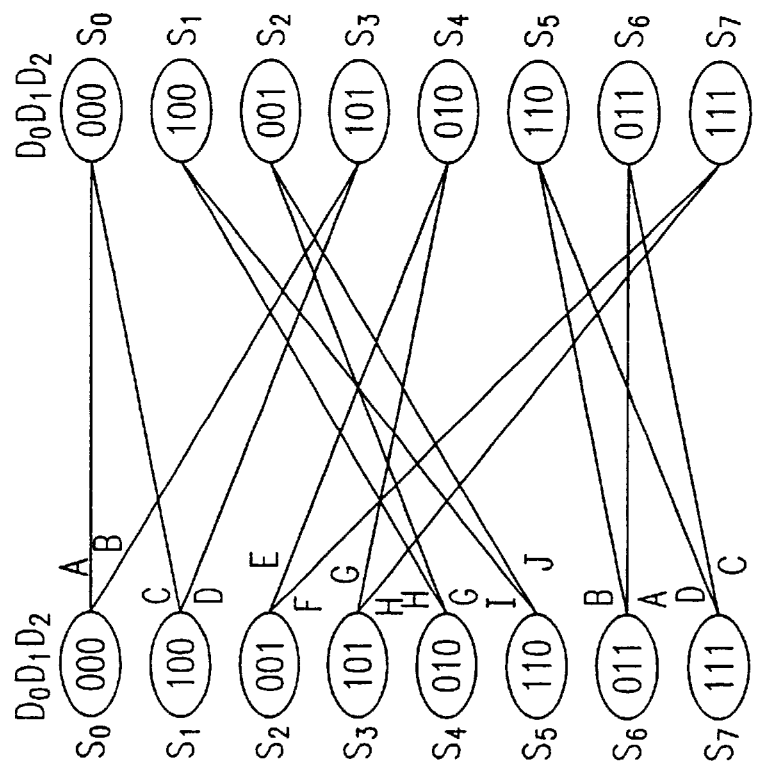

State transition diagram used commonly for 8-state transition and 4-state transition

FIG. 9E

L/$X_2X_1$ for respective branches

| AC | −12  −8 | −4   0 | 4   8 |
|---|---|---|---|
|    | 10 | 00 | 10 |
| BD | −8   −4 | 0   4 | 8   12 |
|    | 11 | 01 | 11 |
| EG | −10  −6 | −2   2 | 6   10 |
|    | 10 | 00 | 10 |
| FH | −6   −2 | 2   6 | 10   14 |
|    | 11 | 01 | 11 |
| HI | −10  −6 | −2   2 | 6   10 |
|    | 11 | 01 | 11 |
| GJ | −14  −10 | −6   −2 | 2   6 |
|    | 10 | 00 | 10 |

FIG. 11A

State transition from time 0 to time 1 (L=−9.4)

| Branch metric | L/X$_2$X$_1$ | X$_1$/coset |
|---|---|---|
| Bm$_A$(1)=(−9.4−(−8))$^2$=1.96 | −8/10 | 0/UA |
| Bm$_B$(1)=(−9.4−(−4))$^2$=29.16 | −4/11 | 1/UC2 |
| Bm$_C$(1)=(−9.4−(−12))$^2$=6.76 | −12/10 | 0/UC1 |
| Bm$_D$(1)=(−9.4−(−8))$^2$=1.96 | −8/11 | 1/UA |
| Bm$_E$(1)=(−9.4−(−6))$^2$=11.56 | −6/10 | 0/UD2 |
| Bm$_F$(1)=(−9.4−(−2))$^2$=54.76 | −2/11 | 1/UB2 |
| Bm$_G$(1)=(−9.4−(−10))$^2$=0.36 | −10/10 | 0/UB1 |
| Bm$_H$(1)=(−9.4−(−6))$^2$=11.56 | −6/11 | 1/UD2 |
| Bm$_I$(1)=(−9.4−(−10))$^2$=0.36 | −10/11 | 1/UB1 |
| Bm$_J$(1)=(−9.4−(−6))$^2$=11.56 | −6/00 | 0/UD1 |

FIG. 11B

| State | Comparison of path metric (Pm(0)+Bm(1)=Bm(1), where Pm(0)=0) | Path metric Pm(1) |
|---|---|---|
| S$_0$ | Bm$_A$(1)= 1.96 < Bm$_C$(1)= 6.76 | Pm$_{S0}$(1)=1.96−0.36=1.6 |
| S$_1$ | Bm$_H$(1)=11.56 > Bm$_I$(1)= 0.36 | Pm$_{S1}$(1)=0.36−0.36=0 |
| S$_2$ | Bm$_G$(1)= 0.36 < Bm$_J$(1)= 11.56 | Pm$_{S2}$(1)=0.36−0.36=0 |
| S$_3$ | Bm$_B$(1)=29.16 > Bm$_D$(1)= 1.96 | Pm$_{S3}$(1)=1.96−0.36=1.6 |
| S$_4$ | Bm$_E$(1)=11.56 > Bm$_G$(1)= 0.36 | Pm$_{S4}$(1)=0.36−0.36=0 |
| S$_5$ | Bm$_B$(1)=29.16 > Bm$_D$(1)= 1.96 | Pm$_{S5}$(1)=1.96−0.36=1.6 |
| S$_6$ | Bm$_A$(1)= 1.96 < Bm$_C$(1)= 6.76 | Pm$_{S6}$(1)=1.96−0.36=1.6 |
| S$_7$ | Bm$_F$(1)=54.76 > Bm$_H$(1)= 11.56 | Pm$_{S7}$(1)=11.56−0.36=11.2 |

State transition from time 1 to time 2 (L=+4.1)

| Branch metric | $L/X_2X_1$ | $X_1$/coset |
|---|---|---|
| $Bm_A(2)=(+4.1-(+8))^2=15.21$ | +8/10 | 0/UA |
| $Bm_B(2)=(+4.1-(+4))^2=0.01$ | +4/01 | 1/UC2 |
| $Bm_C(2)=(+4.1-(+4))^2=0.01$ | +4/10 | 0/UC1 |
| $Bm_D(2)=(+4.1-(+8))^2=15.21$ | +8/11 | 1/UA |
| $Bm_E(2)=(+4.1-(+2))^2=4.41$ | +2/00 | 0/UD2 |
| $Bm_F(2)=(+4.1-(+6))^2=3.61$ | +6/01 | 1/UB2 |
| $Bm_G(2)=(+4.1-(+6))^2=3.61$ | +6/10 | 0/UB1 |
| $Bm_H(2)=(+4.1-(+2))^2=4.41$ | +2/01 | 1/UD2 |
| $Bm_I(2)=(+4.1-(+6))^2=3.61$ | +6/11 | 1/UB1 |
| $Bm_J(2)=(+4.1-(+2))^2=4.41$ | +2/10 | 0/UD1 |

FIG. 12A

| State | Comparison of path metric ($Pm(1)+Pm(2)$) | Path metric $Pm(2)$ |
|---|---|---|
| $S_0$ | $Pm_{S0}(1)+Bm_A(2)=16.81 > Pm_{S1}(1)+Bm_C(2)=\underline{0.01}$ | $Pm_{S0}(2)=0.01-0.01=0$ |
| $S_1$ | $Pm_{S4}(1)+Bm_H(2)=4.41 < Pm_{S5}(1)+Bm_I(2)=5.21$ | $Pm_{S1}(2)=4.41-0.01=4.4$ |
| $S_2$ | $Pm_{S4}(1)+Bm_G(2)=3.61 < Pm_{S5}(1)+Bm_J(2)=6.01$ | $Pm_{S2}(2)=3.61-0.01=3.6$ |
| $S_3$ | $Pm_{S0}(1)+Bm_D(2)=15.21 > Pm_{S1}(1)+Bm_B(2)=5.21$ | $Pm_{S3}(2)=1.61-0.01=1.6$ |
| $S_4$ | $Pm_{S2}(1)+Bm_E(2)=4.41 < Pm_{S3}(1)+Bm_G(2)=5.21$ | $Pm_{S4}(2)=4.41-0.01=4.4$ |
| $S_5$ | $Pm_{S6}(1)+Bm_B(2)=1.61 < Pm_{S7}(1)+Bm_D(2)=26.41$ | $Pm_{S5}(2)=1.61-0.01=1.6$ |
| $S_6$ | $Pm_{S6}(1)+Bm_A(2)=16.81 > Pm_{S7}(1)+Bm_C(2)=11.21$ | $Pm_{S6}(2)=11.21-0.01=11.2$ |
| $S_7$ | $Pm_{S2}(1)+Bm_F(2)=3.61 < Pm_{S3}(1)+Bm_H(2)=6.01$ | $Pm_{S7}(2)=3.61-0.01=3.6$ |

State transition from time 2 to time 3 (L=−5.7)

| Branch metric | L/X₂X₁ | X₁/coset |
|---|---|---|
| $Bm_A(2)=(-5.7-(-8))^2=5.29$ | −8/10 | 0/UA |
| $Bm_B(2)=(-5.7-(-4))^2=2.89$ | −4/11 | 1/UC2 |
| $Bm_C(2)=(-5.7-(-4))^2=2.89$ | −4/00 | 0/UC1 |
| $Bm_D(2)=(-5.7-(-8))^2=5.29$ | −8/11 | 1/UA |
| $Bm_E(2)=(-5.7-(-6))^2=0.09$ | −6/10 | 0/UD2 |
| $Bm_F(2)=(-5.7-(-2))^2=13.69$ | −2/11 | 1/UB2 |
| $Bm_G(2)=(-5.7-(-2))^2=13.69$ | −2/10 | 0/UB1 |
| $Bm_H(2)=(-5.7-(-6))^2=0.09$ | −6/11 | 1/UD2 |
| $Bm_I(2)=(-5.7-(-2))^2=13.69$ | −2/01 | 1/UB1 |
| $Bm_J(2)=(-5.7-(-6))^2=0.09$ | −6/00 | 0/UD1 |

FIG.13B

| State | Comparison of path metric (Pm(2)+Pm(3)) | Path metric Pm(3) |
|---|---|---|
| S0 | $Pms_0(2)+Bm_A(3)=5.29 < Pms_1(2)+Bm_C(3)=7.29$ | $Pms_0(3)=5.29-1.69=3.6$ |
| S1 | $Pms_4(2)+Bm_H(3)=4.49 < Pms_5(2)+Bm_I(3)=15.29$ | $Pms_1(3)=4.49-1.69=2.8$ |
| S2 | $Pms_4(2)+Bm_G(3)=18.09 > Pms_5(2)+Bm_J(3)=1.69$ | $Pms_2(3)=1.69-1.69=0$ |
| S3 | $Pms_0(2)+Bm_B(3)=2.89 < Pms_1(2)+Bm_D(3)=9.69$ | $Pms_3(3)=2.89-1.69=1.2$ |
| S4 | $Pms_2(2)+Bm_E(3)=3.69 < Pms_3(2)+Bm_G(3)=15.29$ | $Pms_4(3)=3.69-1.69=2.0$ |
| S5 | $Pms_6(2)+Bm_B(3)=14.09 > Pms_7(2)+Bm_D(3)=8.89$ | $Pms_5(3)=8.89-1.69=7.2$ |
| S6 | $Pms_6(2)+Bm_A(3)=16.49 > Pms_7(2)+Bm_C(3)=6.49$ | $Pms_6(3)=6.49-1.69=4.8$ |
| S7 | $Pms_2(2)+Bm_F(3)=17.29 > Pms_3(2)+Bm_H(3)=1.69$ | $Pms_7(3)=1.69-1.69=0$ |

State transition from time 3 to time 4 (L=+7.2)

| Branch metric | L/X₂X₁ | X₁/coset |
|---|---|---|
| Bm$_A$(4)=(+7.2−(+8))²=0.64 | +8/10 | 0/UA |
| Bm$_B$(4)=(+7.2−(+4))²=10.24 | +4/01 | 1/UC2 |
| Bm$_C$(4)=(+7.2−(+4))²=10.24 | +4/10 | 0/UC1 |
| Bm$_D$(4)=(+7.2−(+8))²=0.64 | +8/11 | 1/UA |
| Bm$_E$(4)=(+7.2−(+10))²=7.84 | +10/10 | 0/UD2 |
| Bm$_F$(4)=(+7.2−(+6))²=1.44 | +6/01 | 1/UB2 |
| Bm$_G$(4)=(+7.2−(+6))²=1.44 | +6/10 | 0/UB1 |
| Bm$_H$(4)=(+7.2−(+10))²=7.84 | +10/11 | 1/UD2 |
| Bm$_I$(4)=(+7.2−(+6))²=1.44 | +6/11 | 1/UB1 |
| Bm$_J$(4)=(+7.2−(+2))²=27.04 | +2/10 | 0/UD1 |

FIG. 14A

| State | Comparison of path metric (Pm(3)+Pm(4)) | Path metric Pm(4) |
|---|---|---|
| S₀ | Pms$_0$(3)+Bm$_A$(4)=4.24 < Pms$_1$(3)+Bm$_C$(4)=13.04 | Pms$_0$(4)=4.24−0.64=3.6 |
| S₁ | Pms$_4$(3)+Bm$_H$(4)=9.84 > Pms$_5$(3)+Bm$_I$(4)=8.64 | Pms$_1$(4)=8.64−0.64=8.0 |
| S₂ | Pms$_4$(3)+Bm$_G$(4)=3.44 < Pms$_5$(3)+Bm$_I$(4)=34.24 | Pms$_2$(4)=3.44−0.64=2.8 |
| S₃ | Pms$_0$(3)+Bm$_B$(4)=13.84 > Pms$_1$(3)+Bm$_D$(4)=3.44 | Pms$_3$(4)=3.44−0.64=2.8 |
| S₄ | Pms$_2$(3)+Bm$_E$(4)=7.84 > Pms$_3$(3)+Bm$_G$(4)=2.64 | Pms$_4$(4)=2.64−0.64=2.0 |
| S₅ | Pms$_6$(3)+Bm$_B$(4)=15.04 > Pms$_7$(3)+Bm$_D$(4)=0.64 | Pms$_5$(4)=0.64−0.64=0 |
| S₆ | Pms$_6$(3)+Bm$_A$(4)=5.44 < Pms$_7$(3)+Bm$_C$(4)=10.24 | Pms$_6$(4)=5.44−0.64=4.8 |
| S₇ | Pms$_2$(3)+Bm$_F$(4)=1.44 < Pms$_3$(3)+Bm$_H$(4)=9.04 | Pms$_7$(4)=1.44−0.64=0.8 |

FIG. 14B

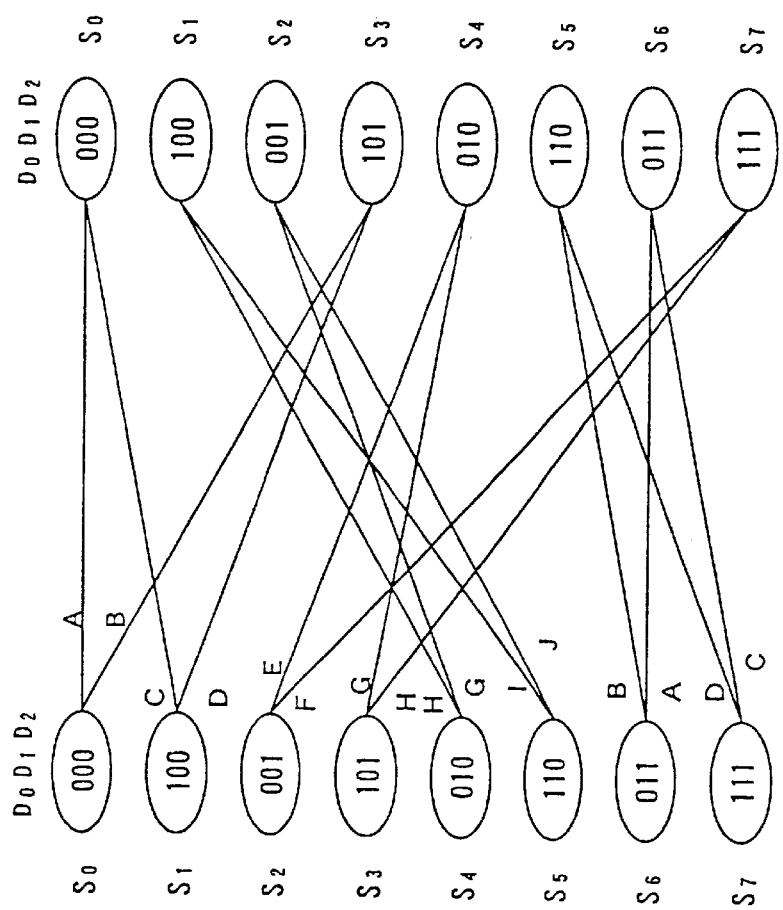

FIG.18A State transition diagram

FIG.18B Relationship between out1, out2 and signal level

| out1, out2 | Signal level |
|---|---|
| 0 | -7, -3, +1, +5 |
| 1 | -5, -1, +3, +7 |

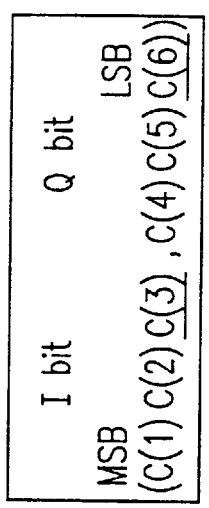
*FIG.21B* Encoding point
*FIG.21C* Encoded bits C(3),C(6)
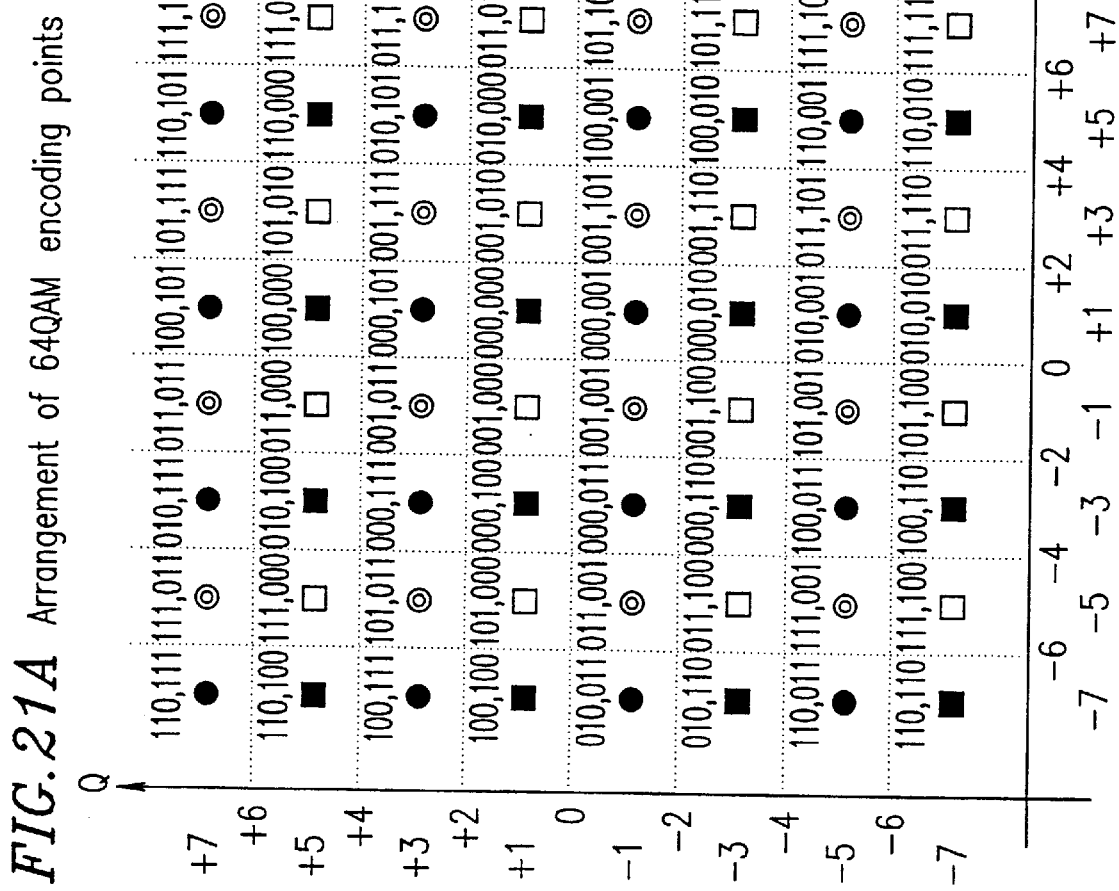
*FIG.21A* Arrangement of 64QAM encoding points 8VSB transmitter 8VSB receiver

ERROR CORRECTION CIRCUIT AND ERROR CORRECTION METHOD

BACKGROUND OF THE INVENTION

1. Field of the Invention

The present invention relates to an error correction circuit for decoding digitally transmitted data which has been subjected to trellis coded modulation (TCM).

2. Description of the Related Art

An 8VSB (Vestigial Sideband) modulation system is employed for the terrestrial digital broadcasting in the U.S. References describing the 8VSB modulation system include, for example, "Digital Television Standard", ATSC, Annex D, 16 Sept. 1995 (hereinafter, "Reference 1"), and "Guide to the Use of the ATSC Digital Television Standard", ATSC, pp. 96–126, 4 Oct. 1995 (hereinafter, "Reference 2").

References 1 and 2 describe encoding and decoding of data based on trellis coded modulation (hereinafter, abbreviated as "TCM") which has been employed for the 8VSB modulation system. A convolutional encoder having 4 internal states is used as a TCM encoder.

FIG. 22 illustrates a transmitter based on the 8VSB modulation system. Referring to FIG. 22, the transmitter comprises terminals 5000, 5004 and 5005, a randomizer 5001, a Reed-Solomon encoder 5002, an interleaver 5003, a trellis encoder unit 5006, and a multiplexer (MUX) 5007. The transmitter further comprises a pilot inserter 5008, a VSB modulator 5009, and an RF up-converter 5010.

A 186-byte MPEG transport strewn (including 1 synchronization byte and 187 data bytes) is input to the terminal 5000. The randomizer 5001 randomizes data input through the terminal 5000, and outputs the randomized data. The Reed-Solomon encoder 5002 performs a Reed-Solomon encoding operation on the randomized data, and outputs the Reed-Solomon-encoded data with 20 Reed-Solomon parity bytes being added to each packet. The interleaver 5003 performs a convolution byte interleave operation on the Reed-Solomon-encoded data at a depth which is about ⅙ (52 data segments) of a data field. The interleaver 5003 does not interleave the synchronization byte, and only interleaves the data bytes.

The trellis encoder unit 5006 performs a trellis encoding operation at a code rate of ⅔ on the data from the interleaver 5003, and maps the encoded data onto an 8-level data series. A segment sync is input to the terminal 5004, and a field sync is input to the terminal 5005. The multiplexer 5007 adds the segment sync and the field sync to the trellis-encoded and mapped data, and frames the obtained data so as to output framed data. The pilot inserter 5008 adds a pilot signal to the framed data. The framed data is subjected to VSB modulation by the VSB modulator 5009, up-converted by the RF up-converter 5010, and then output through an antenna as an RF signal.

FIG. 23 illustrates a receiver based on the 8VSB modulation system. Referring to FIG. 23, the receiver comprises a tuner 5011, an IF filter and synchronous detector 5012, a sync and timing generator 5013, an NTSC interference remover 5014, an equalizer 5015, a phase noise remover 5016, a trellis decoder unit 5017, a deinterleaver 5018, a Reed-Solomon decoder 5019, a derandomizer 5020, and a terminal 5021.

The tuner 5011 tunes to and selectively receives the RF signal from the transmitter, and outputs the received signal. The IF filter and synchronous detector 5012 passes the received signal through an IF filter to convert it to a signal having a predetermined frequency. The converted signal is synchronously detected to convert it to a baseband signal. The sync and timing generator 5013 detects a synchronization signal of the baseband signal so as to time the baseband signal. When the baseband signal contains an NTSC co-channel interference component, the baseband signal is input to the equalizer 5015 after the NTSC co-channel interference component is detected by the NTSC interference remover 5014 and removed by a comb filter in the NTSC interference remover 5014. When no NTSC co-channel interference component is contained, the baseband signal is directly input to the equalizer 5015. The waveform of the baseband signal is equalized by the equalizer 5015, and any phase noise contained therein is removed by the phase noise remover 5016, after which the baseband signal is input to the trellis decoder unit 5017 as encoded data. The trellis decoder unit 5017 performs a trellis decoding operation on the encoded data and outputs the trellis-decoded data. The trellis-decoded data is subjected to a convolution byte deinterleave operation by the deinterleaver 5018, a Reed-Solomon decoding operation by the Reed-Solomon decoder 5019 and a derandomizing operation by the derandomizer 5020, and then output through the terminal 5021.

Such a receiver unit may employ the following methods for decoding data which has been encoded by a 4-state trellis encoder: a method in which the encoded data is decoded based on state transitions among 4 states, in the case where a comb filter is not used (no NTSC co-channel interference component is contained); and a method in which the encoded data is decoded based on state transitions among 8 states, in the case where a comb filter is used (an NTSC co-channel interference component is contained). The 8 states comprise states resulting from the trellis encoder and other states resulting from the comb filter.

The decoding operation for use with TCM is described, for example, in Japanese National Phase PCT Laid-open Publication No. 10-502776 which discloses a trellis coded modulation system for HDTV (hereinafter, "Reference 3"). Reference 3 describes a decoding method using a 4-state trellis decoder, as a decoding method based on state transitions among 4 states for use in the case where a comb filter is not used, and also describes a method using an 8-state trellis decoder, as a decoding method based on transitions among 8 states for use in the case where a comb filter is used.

FIG. 24 Is a block diagram illustrating a conventional trellis decoder unit for decoding encoded data by selectively using a 4-state trellis decoder and an $-state trellis decoder.

The trellis decoder unit corresponds to the trellis decoder unit 5017 in FIG. 23.

Referring to FIG. 24, the trellis decoder unit comprises terminals 5100 and 5112, switches 5101 and 5111, terminals 5101a, 5101b, 5111a and 5111b, demultiplexers (DEMUXs) 5102 and 5105, and multiplexers (MUXs) 5104 and 5110. The trellis decoder unit further comprises 8-state trellis decoders 5103a–5103l, 4-state decoders 5106a–5106l, post-coders 5107a–5107l, adders (modulo 2) 510a–5108l, and 1-symbol delay circuits 5109a–5109l.

The encoded data is input from the phase noise remover 5016 of FIG. 23 to the terminal 5100. When the encoded data contains an NTSC co-channel interference component, the switch 5101 is turned to the terminal 5101a so as to input the encoded data to the demultiplexer 5102. The demultiplexer 5102 divides the encoded data by symbols so as to input the obtained data for the respective symbols to the 6-state trellis decoders 5103a–5103l, respectively. During a segment sync period (in which the data is not trellis-encoded), no data is input to the 8-state trellis decoders 5103a–5103l, while the demultiplexer 5102 switches its selection to the next one of the 8-state trellis decoders 5103a–5103l. The decoded data from each of the 8-state trellis decoders 5103a–5103l is input to the multiplexer 5104, where the data is multiplexed together and output to the deinterleaver 5018 illustrated in FIG. 23.

When the encoded data from the phase noise remover 5016 of FIG. 23 contains no NTSC co-channel interference component, the switch 5101 is turned to the other terminal 5101b so as to input the encoded data to the demultiplexer 5105. Like the demultiplexer 5102, the demultiplexer 5105 divides the encoded data by symbols to input the obtained data for the respective symbols to the 4-state trellis decoders 5106a–5106l, respectively. During a segment sync period, no data is input to the 4-state trellis decoders 5106a–5106l, while the demultiplexer 5105 switches its selection to the next one of the 4-state trellis decoders 5106a–5106l. Data $Y_2Y_1$ from each of the 4-state trellis decoders 5106a–5106l is input to the postcoders 5107a–5107l, respectively, where the data $Y_2$ is passed through a feed forward loop to obtain data $X_2$. As a result, decoded data $X_2X_1$ is obtained. The decoded data $X_2X_1$ from each of the postcoders 5107a–5107l is input to the multiplexer 5110, where the data is multiplexed together and output to the deinterleaver 5018 illustrated in FIG. 23.

Accordingly, when an NTSC co-channel interference component is contained, the switch 5111 is turned to the terminal 5111a so as to select the 8-state trellis decoder, When no NTSC co-channel interference component is contained, the switch 5111 is turned to the terminal 5111b so as to select the 4-state trellis decoder.

FIG. 25 illustrates a 4-state trellis decoder. Referring to FIG. 25, the 4-state trellis decoder comprises terminals 5200, 5205 and 5206, a branch metric production circuit 5201, an ACS (Add Compare Select) circuit 5202, a path metric memory 5203, and a trace back memory 5204.

The encoded data from the demultiplexer 5105 illustrated in FIG. 24 is input to the input terminal 5200 of the 4-state trellis decoder 5106 illustrated in FIG. 25. The 4-state trellis decoder 5106 decodes the encoded data as follows using a Viterbi algorithm.

There are two possible state transitions from state $S_i$ at time t (t is an integer) to state $S_k$ at time t+1 which are respectively used as symbol subsets, and each branch extends to the next state, There are two possible state transitions from time t to state $S_k$ at time t+1 (i.e., one from state $S_i$ at time t and another from state $S_j$ at time t). The branch metric production circuit 5201 produces a branch metric for each branch for each encoded data, and outputs the produced branch metric to the ACS circuit 5202. The ACS circuit 5202 adds the branch metric for each branch to a path metric for each state stored in the path metric memory 5203, and selects the smaller one of the obtained sums to be used as a new path metric for the state. The new path metric for the state is stored in the path metric memory 5203. Data corresponding to the selected path for the state (containing a candidate for data $Y_2$ and path selection information) Is stored in the trace back memory 5204. The trace back memory 5204 traces back a predetermined cut-off path length along a surviving path which contains a state whose new path metric is smallest so as to determine a subset and data Y, to reconstruct the data, thereby determining data $Y_2$. The data $Y_2$ is output to the terminal 5205 and the data $Y_1$ is output to the terminal 5206.

FIG. 26 illustrates an 8-state trellis decoder. Referring to FIG. 26, the 8-state trellis decoder comprises terminals 5300, 5307 and 5308, a delay circuit 5301, a branch metric production circuit 5302, an ACS circuit 5303, a path metric memory 5304, a trace back memory 5305, and a slicer 5306.

The encoded data from the demultiplexer 5102 of FIG. 24 is input to the terminal 5300 of the 8-state trellis decoder 5103. Like the 4-state trellis decoder 5106, the 8-state trellis decoder 5103 decodes the encoded data as follows using a Viterbi algorithm.

There are two possible state transitions from state $S_i$ at time t to state $S_k$ at time t+1. There are two possible state transitions to state $S_k$ at time t+1 (i.e., one from state $S_i$ at time t and another from state $S_j$ at time t). The branch metric production circuit 5302 produces a branch metric for each branch for each encoded data, and outputs the produced branch metric to the ACS circuit 5303. The ACS circuit 5303 adds the branch metric for each branch to a path metric for each state stored in the path metric memory 5304, and selects the smaller one of the obtained sums to be used as a new path metric for the state. The new path metric for the state is stored in the path metric memory 5304. Data corresponding to the selected path for the state (containing a candidate for a coset and path selection information) is stored in the trace back memory 5305. The trace back memory 5305 traces back a predetermined cut-off path length along a surviving path which contains a state whose new path metric is smallest so as to determine the coset and the data XI. The data XI is output to the terminal 5307, The delay circuit 5301 delays the data from the terminal 5300 for a period of time corresponding to an amount of delay by the trace back memory 5305 before the data is output to the slicer 5306. The slicer 5306 determines the data $X_2$ by identifying the coset based on the delayed data, and outputs the data $X_2$ to the terminal 5308.

When the above-described conventional device performs a decoding operation by using a 4-state trellis decoder, the device first decodes the subset and data $Y_1$ to reconstruct the data, thereby decoding data $Y_2$. When decoding encoded data using an 8-state trellis decoder, the data $X_1$ is first decoded, and then the data $X_2$ is decoded by using the slicer to identify the coset based on the delayed data. Consequently, the decoding operation for the data $X_2$ requires the delay circuit and the slicer, and the decoding method is complicated.

Moreover, the prior art requires 12 4-state trellis decoders and 12 8-state trellis decoders, thereby increasing the circuit scale.

A communication system based on TCM includes the digital CATV in the U.S. The digital CATV employs a 64QAM (Quadrature Amplitude Modulation) system and a 256QAM system, The 64QAM and 256QAM systems in the U.S. are described, for example, in "ITU-T Recommendation J.83 ANNEXB" (hereinafter, "Reference 4"), Reference 4 describes an error correction technique which is employed in the 64QAM system and the 256QAM system in the U.S.

FIG. 27 illustrates a transmitter 701 and a receiver 706 of the digital CATV in the U.S. In FIG. 27, a transmission path 705 is provided between the transmitter 701 and the receiver 706. The transmitter 701 comprises a terminal 700, an MPEG framing section 702, an error correction encoding section 703, and a QAM modulation section 704. The receiver 706 comprises a QAM demodulation section 707, an error correction decoding section 708, an MPEG framing section 709, and a terminal 710, Data in the MPEG2 transport stream format is input to the terminal 700. The MPEG framing section 702 of the transmitter 701 performs a linear encoding operation on the input data so that the parity check sum of the data is 0×47 (i.e., "47" in hexadecimal expression). The error correction encoding section 703 performs an error correction encoding operation on the linearly-encoded data. The QAM modulation section 704 performs a QAM modulation operation on the error-correction-encoded data, and transmits the OAM-modulated data to the receiver 706 via the transmission path 703.

The QAM demodulation section 707 of the receiver 706 performs a OAM demodulation operation on the data received via the transmission path 705. The error correction decoding section 708 performs an error correction operation on the QAM-demodulated data. The MPEG framing section 709 detects an error by multiplying the error-corrected data by a parity check matrix (so as to check whether the parity check sum is 0×47), and converts the data to an MPEG2 transport stream format.

FIGS. 28A and 28B illustrate the error correction encoding section 703 and the error correction decoding section 708, respectively.

The error correction encoding section 703 illustrated in FIG. 28A comprises a terminal 800, a Reed-Solomon encoder 801, an interleaver 802, a randomizer 803, and a trellis encoder 804.

The Reed-Solomon encoder 801 encodes the linearly-encoded data from the MPEG framing section 702 into RS (128, 122) (1 symbol=7 bits). The interleaver 802 performs a convolution interleave operation on the Reed-Solomon-encoded data. The randomizer 803 randomizes the interleaved data. The trellis encoder 804 performs a trellis encoding operation on the randomized data at a code rate of 14/15 (for the 64QAM system; a code rate of 19/20 is used for the 256QAM system). The trellis-encoded data is QAM-modulated by the QAM modulation section 704 and then transmitted onto the transmission path 705.

The error correction decoding section 708 illustrated in FIG. 28B comprises a trellis decoder 805, a derandomizer 806, a deinterleaver 807, a Reed-Solomon decoder 808, and a terminal 809.

The trellis decoder 805 performs a trellis decoding operation on the QAM-demodulated data from the QAM demodulation section 707. The deinterleaver 807 performs a convolution deinterleave operation on the derandomized data. The Reed-Solomon decoder 808 performs a Reed-Solomon decoding operation on the interleaved data. The Reed-Solomon-decoded data is output after being converted to the MPEG2 transport stream format by the MPEG framing section 709.

Next, the error correction encoding operation will be further described (for more detail, see Reference 1).

FIG. 29 illustrates a parser 901 provided in the stage following the trellis encoder 804 (the parser 901 is not illustrated in FIG. 28A), the trellis encoder 804, and a QAM mapper 907 provided in the QAM modulation section 704.

Referring to FIG. 29, there are provided terminals 900, 908 and 909, a non-encoding section 902, an encoding section 903, a differential precoder 904, a 1/2 convolutional encoder and 4/5 puncturer 905, and another 1/2 convolutional encoder and 4/5 puncturer 906. The "1/2 convolutional encoder" as used herein refers to a convolutional encoder for convolutional-encoding data at a code rate of 1/2, and the "4/5 puncturer" as used herein refers to a puncturer for puncturing data at a code rate of 4/5.

The trellis encoder 804 comprises the non-encoding section 902 and the encoding section 903. The encoding section 903 comprises the differential precoder 904 and the two 1/2 convolutional encoder and 4/5 puncturers 905 and 906.

The output from the randomizer 803 of FIG. 28A is input to the terminal 900. The parser 901 divides the data series ($I_0$–$I_{13}$, $Q_0$–$Q_{13}$) input from the terminal 900 into bits to be non-encoded($I_0$–$I_9$, $Q_0$–$Q_9$) and bits to be encoded ($I_{10}$–$I_{13}$, $Q_{10}$–$Q_{13}$). The differential precoder 904 performs a differential encoding operation on the bits to be encoded ($I_{10}$–$I_{13}$, $Q_{10}$–$Q_{13}$). Each of the 1/2 convolutional encoder and 4/5 puncturers 905 and 906 performs a convolution operation at a code rate of 1/2 and a puncturing operation at a code rate of 4/5 on the differential-encoded data so as to obtain the encoded bits ($I_{10}'$–$I_{14}'$, $Q_{10}'$–$Q_{14}'$). The QAM mapper 907 performs a 64QAM mapping operation on the non-encoded bits ($I_0$–$I_9$, $Q_0$–$Q_9$) and the encoded bits ($I_{10}'$–$I_{14}'$, $Q_{10}'$–$Q_{14}'$), and outputs the obtained I data through the terminal 908 and the obtained Q data through the terminal 909.

Thus, for the 64QAM system, 28 bits of data are input through the terminal 900, 20 bits of which are input to the non-encoding section 902, with the remaining 8 bits being input to the encoding section 903, and a trellis encoding operation at a code rate of 14/15 is performed so as to obtain 30 bits of data. Then, a 64QAM mapping operation is performed so as to output the I data and the Q data through the terminals 908 and 909, respectively.

For the 256QAM system, 30 bits of data out of the 38 bits of input data (10 non-encoded bits of data are additionally provided in the 256QAM system as compared to the 64QAM system) are input to the non-encoding section, with the remaining 8 bits of data being input to the encoding section, and a trellis encoding operation at a code rate of 19/20 is performed so as to obtain 40 bits of data. Then, a 256QAM mapping operation is performed, and the obtained data is output as I data and Q data.

FIG. 30 illustrates an operation of the parser 901 of FIG. 29. In FIG. 30, data 1000, 1001, 1002 and 1003 each contains 7 bits of data (RS#1–RS#4) which has been Reed-Solomon-decoded, interleaved and randomized. The data 1000 and the data 1001 are I symbols, and the data 1002 and the data 1003 are Q symbols. Data 1004 and data 1006 contain non-encoded bits ($I_0$–$I_6$) and data 1005 contains non-encoded bits ($I_7$–$I_9$) and encoded bits ($I_{10}$–$I_{13}$). Data 1007 contains the non-encoded bits ($I_7$–$I_9$), and data 1008 contains the encoded bits ($I_{10}'$–$I_{14}'$).

The I symbol 1000 and the lower 3 bits ($I_7$–$I_9$) of the I symbol 1001 input to the parser 901 are divided into two series of non-encoded bits ($I_1$, $I_3$, $I_5$, $I_7$, $I_9$) and ($I_0$, $I_2$, $I_4$, $I_6$, $I_8$). The upper 4 bits ($I_{10}$–$I_{13}$) of the I symbol 1001 input to the parser 901, as the encoded bits, are differential-encoded, convolutional-coded, and punctured, so as to obtain 5 bits of data ($I_{10}$–$I_{14}'$). The Q symbols input to the parser 901 are processed in substantially the same manner.

FIG. 31 illustrates in greater detail the differential precoder 904 of FIG. 29. Referring to FIG. 31, the precoder 904 comprises terminals 1100, 1101, 1103 and 1104.

The I data $I_{10}$–$I_{13}$(=$W_j$) from the parser 901 is input to the terminal 1100, and the Q data $Q_{10}$–$Q_{13}$(=Z) from the parser 901 is input to the terminal 1101. The differential precoder 904 perform's a differential encoding operation on the I data $I_{10}$–$I_{13}$ and the Q data $Q_{10}$–$Q_{13}$ based on the following differential encoding formulae (1) and (2) (where j is an integer), and outputs the differential-encoded data $X_j$, $Y_j$ through the terminals 1103 and 1104.

$$X_a = W_j + X_{j-1} + Z_j(X_{j-1} + Y_{j-1}) \quad (1)$$

$$Y_j = Z_j + W_j + Y_{j-1} + Z_j(X_{j-1} + Y_{j-1}) \quad (2)$$

FIG. 32 is a block diagram illustrating in greater detail the 1/2 convolutional encoder and 4/5 puncturer 905, 906 of FIG. 29. Referring to FIG. 32, the 1/2 convolutional encoder and 4/5 puncturer comprises terminals 1200, 1209, 1210 and 1211, a convolutional encoder 1201 for encoding data at a code rate of 1/2, delay circuits 1203–1206, adders 1202 and 1207 (modulo 2), and a puncturer 1208 for encoding data at a code rate of 4/5.

The I data $(I_{10}-I_{13})(X_3)$ which has been differential-encoded by the differential precoder 904 is input through the terminal 1200 (as indicated by "in" in the figure). A convolution operation at a code rate of 1/2 is performed on the data $(I_{10}-I_{13})$ so as to output $(I_{10}, I_{11}, I_{10}30\ I_{12}\ I_{11}+I_{13})$ to the terminal 1209 ("out1") and $(I_{10}, I_{11}, I_{10}+I_{11}, I_{10}+I_{11}+I_{12}, I_{10}+I_{11}+I_{12}+I_{13})$ to the terminal 1210 ("out2").

The 4/5 puncturer 1208 punctures the output of each of the terminals 1209 and 1210 based on the puncture matrix (0001, 1111) so as to output $(I_{10}, I_{10}+I_{11}, I_{10}+I_{11}+I_{12}, I_{11}+I_{13}, I_{10}+I_{11}+I_{12}+I_{13})=(I_{10}'-I_{14}')$ to the terminal 1211, The Q data $(Y_j)$ from the differential precoder 904 is processed in substantially the same manner as the I data.

FIGS. 33A, 33B and 33C illustrate an arrangement of 64QAM encoding points in the CAM mapper 907 of FIG. 29.

The QAM mapper 907 has the arrangement of 64QAM encoding points as illustrated in FIG. 33A. The C data Its derived from values along the vertical axis, and the I data is derived from values along the horizontal axis. As illustrated in FIG. 33B, each encoding point is represented as (I bit, Q bit)=(C(1) C(2) C(3), C(4) C(5) C(6)). C(1) C(2) C(4) and C(5) are non-encoded bits, and C(3) and C(6) are encoded bits (see FIG. 29). As illustrated in FIG. 33C, there are four combinations (indicated respectively by the symbols "●", "■", "□", "☉") of the encoded bits C(3) and C(6), each of which can be either "1" or "0". The bit being "0" corresponds to signal levels "−7, −3, +1, +5", and the bit being "1 corresponds to signal levels "−5, −1, +3, +7". The I data and the Q data corresponding to the encoding point (C(1) C(2) C(3), C(4) C(5) C(6)) are obtained and output with reference to the arrangement of 64OAM encoding points of FIG. 33A.

Next, the error correction decoding operation will be further described.

A decoding operation for decoding convolutional-encoded and punctured data is described, for example, in Japanese Laid-open Publication No. 8-288967 which discloses a transmission system and a transceiver therefor, and a trellis decoder (hereinafter, "Reference 5"). Reference 5 describes a method for decoding non-encoded bits by decoding encoded bits with a Viterbi decoder and by using data obtained by convolutional-encoding (re-encoding) the Viterbi-decoded data.

FIG. 34 illustrates in greater detail the trellis decoder 805 and a deparser 1412 provided in the stage following the trellis decoder 805 (the deparser 1412 is not illustrated in FIG. 28B).

Referring to FIG. 34, there are provided terminals 1400, 1401 and 1413, A non-decoded bit decoding section 140z comprises an area determination section 1403, a delay circuit 1404, a convolutional encoder 1405 for encoding data at a code rate of 1/2, a puncturer 1406 for encoding data at a code rate of 4/5, and a selection section 1407. A encoded bit decoding section 1408 comprises a depuncturer 1409, a Viterbi decoder 1410, and a differential postcoder 1411.

The trellis decoder 805 comprises the non-decoded bit decoding section 1402 and the encoded bit decoding section 1408.

The encoded bit decoding section 1408 receives the QAM-demodulated I data and Q data through the terminals 1400 and 1401, respectively. The depuncturer 1409 depunctures the I data and the C data, and outputs the depunctured I data $(I_{dp})$ and C data $(Q_{dp})$. The Viterbi decoder 1410 performs a Viterbi decoding operation on the depunctured I data $(I_{dp})$ and Q data $(Q_{dp})$. The differential postcoder 1411 performs a differential decoding operation on the Viterbi-decoded I data $(I_v)$ and Q data $(O_v)$, and outputs the differential-decoded data.

The non-decoded bit decoding section 1402 receives the QAM-demodulated I data and Q data at the area determination section 1403. The area determination section 1403 selects one of the areas which are numbered from 1 to 49 as in FIG. 33A, and outputs area information "A" which indicates the determined area.

Referring to FIG. 33A, there are provided 49 areas of 64QAM encoding point such that each area has the four different encoding points ("●", "■", "□", "☉") at the four corners thereof, respectively. An outermost area, such as area 1 or area 2, preferably includes the peripheral area around it.

The delay circuit 1404 delays the area information "A". The 1/2 convolutional encoder 1405 performs a convolution operation at a code rate of 1/2 on the Viterbi-decoded I data $(I_v)$ and C data $(C_v)$. The 4/5 puncturer 1406 performs a puncturing operation at a code rate of 4/5 on the convolutional-encoded I data $(I_c)$ and Q data $(Q_c)$, and decodes the encoded bits C(3) and C(6), so as to output the decoded data to the selection section 1407.

Utilizing the fact that the four encoding points ("●", "■", "□", "☉") belonging to the same area have respectively different combinations of the encoded bits C(3) and C(6), the selection section 1407 decodes the non-encoded bits based on the area information "Ad", and the encoded bits C(3) and C(6) which have been decoded.

The encoded and non-encoded bits which have been decoded as described above are input to the deparser 1412. The deparser 1412 puts together the I bits and the Q bits, respectively, so as to output them through the terminal 1413 as I symbols and Q symbols.

In the above-described prior art, the non-decoded bits are decoded by using, in combination: the area information, and the data obtained by convolutional-encoding (re-encoding) and puncturing the Viterbi-decoded data by the convolutional encoder 1405 and the puncturer 1406. Accordingly, error propagation may occur during the convolutional-encoding (re-encoding) operation, particularly when C/N is poor, thereby increasing the error rate. Moreover, the decoding operation is complicated.

Two conventional devices for encoding and decoding data based on TCM have been described above. They both perform a trellis decoding operation on encoded data, in which it is required to perform a convolutional-encoding (re-encoding) operation on the encoded data. The former device performs a convolution operation on the encoded data by the trellis decoder 5103 illustrated in FIG. 26, whereas the latter device performs a convolution operation on the encoded data by the convolutional encoder 1405 illustrated in FIG. 34.

When a convolutional-encoding (re-encoding) operation is performed on the decoding side, as above-described, the error rate may rapidly increase if error propagation occurs. Moreover, the prior art devices require the delay circuit 5301 illustrated in FIG. 26 or the delay circuit 1404 illustrated in FIG. 34, and the data is delayed before used, thereby complicating the data processing operation and the circuit configuration.

SUMMARY OF THE INVENTION

According to one aspect of this invention, an error is correction circuit is provided for receiving and decoding a trellis-encoded signal of a series of data $Z_q, Z_{q-1}, \ldots, Z_1$ which comprises convolutional-encoded bits and unencoded bits, the convolutional-encoded bits being obtained by convolutional-encoding lower t bits $X_t, X_{t-1}, \ldots X_1$ of an input p-bit series of data $X_p, X_{p-1}, \ldots, X_1$ (where $p \geq 2$, $q \geq p$, and $p > t \geq 1$), and the unencoded bits being obtained by not convolutional-encoding upper (p-t) bits thereof. The circuit comprises: a maximum likelihood decoder for pre-selecting one of m parallel paths of transition from state x at time k to state y at time k+1.

In one embodiment of the invention, the maximum likelihood decoder comprises: a selection section for selecting one of them parallel paths transition from state x at time k to state y at time k+1; and a calculation section for obtaining a path metric using a branch metric.

In one embodiment of the invention, the error correction circuit receives and decodes data which is produced by mapping the series of data $Z_q, Z_{q-1}, \ldots, Z_1$ onto j points. The series of data $Z_q, Z_{q-1}, \ldots, Z_1$ is obtained by performing a trellis encoding operation on a first series of data $Y_r, Y_{r-1}, \ldots, Y_{t+1}$ ($r > t \geq 1$) and a second series of data $Y_t, Y_{t-1}, \ldots, Y_1$, the first series of data being obtained by preceding upper bits of the input series of data $X_p, X_{p-1}, \ldots, X_1$ ($p \geq 2$), and the second series of data comprising lower bits of the input series of data $X_p, X_{p-1}, \ldots, X_1$. The maximum likelihood decoder is operable to perform n different maximum likelihood decoding methods for maximum-likelihood-decoding the received data based on a plurality of states. The maximum likelihood decoder selects one of the n maximum likelihood decoding methods so as to maximum-likelihood-decode the received data based on the selected maximum likelihood decoding method.

In one embodiment of the invention, the error correction circuit further comprises a postcoder for postcoding or not postcoding the decoded data from the maximum likelihood decoder. Whether the decoded data is postcoded or not depends upon the n maximum likelihood decoding methods.

In one embodiment of the invention, the maximum likelihood decoder further comprises: a branch metric production section for producing first path information indicating the selected path and a branch metric according to the n maximum likelihood decoding methods; a calculation section for obtaining a path metric based on the branch metric obtained by the branch metric production section and for obtaining second path information based on the path metric; a path metric memory for storing the path metric obtained by the calculation section; a path memory for storing the first path information obtained by the selection section and the second path information obtained by the calculation section; and a trace back section for obtaining decoded data based on the path metric obtained by the calculation section and the first and second path information stored in the path memory.

In one embodiment of the invention, the maximum likelihood decoder further comprises: a branch metric production section for producing first path information indicating the selected path and a branch metric based on the n maximum likelihood decoding methods; a calculation section for obtaining a path metric based on the branch metric obtained by the branch metric production section and for obtaining second path information based on the path metric: a path metric memory for storing the path metric obtained by the calculation section; a path memory for storing the first path information obtained by the selection section and the second path information obtained by the calculation section: and a register exchange section for obtaining the decoded data based on the path information and the path metric obtained by the calculation section and the candidate for the decoded data comprising the first path information and the second path information stored in the path memory.

In one embodiment of the invention, the postcoder comprises a memory for storing upper bits of the decoded data from the maximum likelihood decoder.

In one embodiment of the invention, the maximum likelihood decoder comprises a branch metric production section. The branch metric production section references contents of a diagram so as to derive first path information indicating the selected path and a branch metric from the received data, wherein the contents of the diagram are obtained by associating the first series of data $Y_r, Y_{r-1}, \ldots, Y_{t+1}$, the second series of data $Y_t, Y_{t+1}, \ldots, Y_1$, and the received data, which is produced by mapping the series of data $Z_q, Z_{q-1}, \ldots, Z_1$ onto j points, with one another.

In one embodiment of the invention, the maximum likelihood decoder comprises a branch metric production section. The branch metric production section references contents of a diagram so as to derive first path information indicating the selected path and a branch metric from data is which is obtained by passing the received data through a linear filter, wherein the contents of the diagram are obtained by associating the series of data $X_p, X_{p-1}, \ldots, X_1$ and data obtained by passing, through the linear filter, data which is produced by mapping the series of data $Z_q, Z_{q-1}, \ldots, Z_1$ onto j points, with each other.

In one embodiment of the invention, the linear filter comprises a comb filter.

In one embodiment of the invention, the maximum likelihood decoder comprises a branch metric production section. The branch metric production section references contents of a diagram so as to derive a candidate for the decoded data and a branch metric from the received data, wherein the contents of the diagram are obtained by associating the first series of data $Y_r, Y_{r-1}, \ldots, Y_{t+1}$, the second series of data $Y_t, Y_{t-1}, \ldots, Y_1$, and the received data, which is produced by mapping the series of data $Z_q, Z_{q-1}, \ldots, Z_1$ onto j points, with one another.

In one embodiment of the invention, the maximum likelihood decoder comprises a branch metric production section. The branch metric production section references contents of a diagram so as to derive a candidate for the decoded data and a branch metric from data obtained by passing the received data through a linear filter, wherein the contents of the diagram are obtained by associating the series of data $X_p, X_{p-1}, \ldots, X_1$ and data obtained by passing, through the linear filter, data which is produced by mapping the series of data $Z_q, Z_{q-1}, \ldots, Z_1$ onto j points, with each other.

In one embodiment of the invention, the linear filter comprises a comb filter.

In one embodiment of the invention, the maximum likelihood decoder performs a decoding operation using a Viterbi algorithm.

In one embodiment of the invention, the error correction circuit receives and decodes data which is produced by mapping the trellis-encoded signal onto a 2-dimensional data series. The error correction circuit further comprises a section for demapping a series of data which is obtained through a maximum likelihood decoding operation on the 2-dimensional data series by the maximum likelihood decoder.

In one embodiment of the invention, the error correction circuit further comprises a section for delaying the demapped series of data.

In one embodiment of the invention, the error correction circuit receives and decodes data which is produced by mapping the trellis-encoded signal onto a 2-dimensional data series. The c-bit trellis-encoded signal is a series of data $Z_q, Z_{q-1}, \ldots, Z_1$ which comprises convolutional-encoded bits and unencoded bits, the convolutional-encoded bits being obtained by performing a differential encoding operation on lower t bits $X_t, X_{t-1}, \ldots, X_1$ of the input p-bit series of data $X_p, X_{p-1}, \ldots X_1$ (where $p \geq 2$, $q \geq p$, and $p > t \geq 1$) and convolutional-encoding the differential-encoded bits, and the unencoded bits being obtained by not convolutional-encoding upper (p-t) bits thereof. The error correction circuit further comprises: a section for performing a differential decoding operation on a first series of data which is produced through a maximum likelihood decoding operation on the 2-dimensional data series by the maximum likelihood decoder; and a section for demapping a second series of data which is produced through a maximum likelihood decoding operation on the 2-dimensional data series by the maximum likelihood decoder.

In one embodiment of the invention, the error correction circuit further comprises a section for delaying the demapped series of data.

In one embodiment of the invention, the error correction circuit receives and decodes data which is produced by mapping the trellis-encoded signal onto a 2-dimensional data series. The c-bit trellis-encoded signal is a series of data $Z_q, Z_{q-1}, \ldots, Z_1$ which comprises punctured bits and unencoded bits, the punctured bits being obtained by convolutional-encoding lower t bits $X_t, X_{t-1}, \ldots, X_1$ of the input p-bit series of data $X_p, X_{p-1}, \ldots, X_1$ (where $p \geq 2$, $g \geq p$, and $p > t \geq 1$) and puncturing the convolutional-encoded bits, and the unencoded bits being obtained by not convolutional-encoding upper (p-t) bits thereof. The error correction circuit further comprises: a section for depuncturing the 2-dimensional data series: a section for puncturing a second series of data which is produced through a maximum likelihood decoding operation on the depunctured series of data by the maximum likelihood decoder; and a section for demapping the punctured series of data.

In one embodiment of the invention, the error correction circuit further comprises a section for delaying the demapped series of data.

In one embodiment of the invention, The error correction circuit receives and decodes data which is produced by mapping the trellis-encoded signal onto a 2-dimensional data series. The c-bit trellis-encoded signal is a series of data $Z_p, Z_{q-1}, \ldots Z_1$ which comprises punctured bits and unencoded bits, the punctured bits being obtained by performing a differential encoding operation on lower t bits $X_t, X_{t-1}, \ldots X_1$ of the input p-bit series of data $X_p, X_{p-1}, \ldots, X_1$ (where $p \geq 2$, $g \geq p$, and $p > t \geq 1$), convolutional-encoding the differential-encoded bits, and puncturing the convolutional-encoded bits, and the unencoded bits being obtained by not convolutional-encoding upper (p-t) bits thereof. The error correction circuit further comprises: a section for depuncturing the 2-dimensional data series; a section for performing a differential decoding operation on a first series of data which is produced through a maximum likelihood decoding operation on the depunctured series of data by the maximum likelihood decoder; a section for puncturing a second series of data which is produced through a maximum likelihood decoding operation on the depunctured series of data by the maximum likelihood decoder; and a section for demapping the punctured series of data.

In one embodiment of the invention, the error correction circuit further comprises a section for delaying the demapped series of data.

In one embodiment of the invention, the maximum likelihood decoder comprises: a section for producing a branch metric a section for addition, comparison and selection of branch metrics and path metrics; a path metric memory for storing a plurality of path metrics; a plurality of path memories; and a trace back processing section for outputting a first series of data which is obtained by decoding a series of encoded data, and a second series of data which to obtained by decoding a series of data which contains information of a series of unencoded data.

In one embodiment of the invention, the maximum likelihood decoder comprises: a section for producing a branch metric; a section for addition, comparison and selection of branch metrics and path metrics; a path metric memory for storing a plurality of path metrics; a plurality of path memories; and a register exchange section for outputting a first series of data which is obtained by decoding a series of encoded data, and a second series of data which is obtained by decoding a series of data which contains information of a series of unencoded data.

According to another aspect of this invention, an error correction circuit comprises a maximum likelihood decoder for performing a maximum likelihood decoding operation on a series of data. The maximum likelihood decoder comprises: a section for producing a branch metric; a section for addition, comparison and selection of branch metrics and path metrics; a path metric memory for storing a plurality of path metrics; a plurality of path memories; and a trace back processing section for outputting a first series of data which is obtained by decoding a series of encoded data, and a second series of data which is obtained by decoding a series of data which contains information of a series of unencoded data.

According to another aspect of this invention, an error correction circuit comprises a maximum likelihood decoder for performing a maximum likelihood decoding operation on a series of data. The maximum likelihood decoder comprises: a section for producing a branch metric; a section for addition, comparison and selection of branch metrics and path metrics: a path metric memory for storing a plurality of path metrics; a plurality of path memories; and a register exchange section for outputting a first series of data which is obtained by decoding a series of encoded data, and a second series of data which is obtained by decoding a series of data which contains information of a series of unencoded data.

According to another aspect of this invention, an error correction method is provided for receiving and decoding a trellis-encoded signal of a series of data $Z_q, Z_{q-1}, \ldots, Z_1$ which comprises convolutional-encoded bits and unencoded bits, the convolutional-encoded bits being obtained by convolutional-encoding lower bits $X_t, X_{t-1}, \ldots X_1$ of an input p-bit series of data $X_p, X_{p-1}, \ldots, X_1$ (where $p \geq 2$, $q \geq p$, and $p > t \geq 1$), and the unencoded bits being obtained by not convolutional-encoding upper (p-t) bits thereof. The method comprises: a maximum likelihood decoding step of preselecting one of m parallel paths of transition from state x at time k to state y at time k+1.

In one embodiment of the invention, the maximum likelihood decoding step comprises: a selection step of selecting one of them parallel paths transition from state x at time k to state y at time k+1; and a calculation step of obtaining a path metric using a branch metric.

In one embodiment of the invention, the error correction method is for receiving and decoding data which is produced by mapping the series of data $Z_q, Z_{q-1}, \ldots, Z_1$ onto j points.

The series of data $Z_q, Z_{q-1}, \ldots, Z_1$ is obtained by performing a trellis encoding operation on a first series of data. $Y_r, Y_{r-1}, \ldots Y_{t+1}$ ($r > t \geq 1$) and a second series of data $Y_t, Y_{t-1}, \ldots, Y_1$, the first series of data being obtained by preceding upper bits of the input series of data $X_p, X_{p-1}, \ldots, X_1$ ($p \geq 2$), and the second series of data comprising lower bits of the input series of data $X_p, X_{p-1}, \ldots, X_1$. The maximum likelihood decoding step is operable to perform n different maximum likelihood decoding methods for maximum-likelihood-decoding the received data based on a plurality of states, wherein the maximum likelihood decoder selects one of the n maximum likelihood decoding methods so as to maximum-likelihood-decode the received data based on the selected maximum likelihood decoding method.

In one embodiment of the invention, the error correction method further comprises a postcoding step of postcoding or not postcoding the decoded data from the maximum likelihood decoding step. Whether the decoded data is postcoded or not depends upon the n maximum likelihood decoding methods.

In one embodiment of the invention, the maximum likelihood decoding step comprises: a branch metric production step of producing first path information indicating the selected path and a branch metric according to the n maximum likelihood decoding methods, a calculation step of obtaining a path metric based on the branch metric obtained in the branch metric production step and obtaining second path information based on the path metric; a path metric memory step of storing the path metric obtained in the calculation step; a path memory step of storing the first path information obtained in the selection step and the second path information obtained in the calculation step; and a trace back step of obtaining decoded data based on the path metric obtained in the calculation step and the first and second path information stored in the path memory step.

In one embodiment of the invention, the maximum likelihood decoding step comprises: a branch metric production step of producing first path information indicating the selected path and a branch metric based on the n maximum likelihood decoding methods; a calculation step of obtaining a path metric based on the branch metric obtained in the branch metric production step and obtaining second path information based on the path metric; a path metric memory step of storing the path metric obtained in the calculation step; a path memory step of storing the first path information obtained in the selection step and the second path information obtained in the calculation step; and a register exchange step of obtaining the decoded data based on the path information and the path metric obtained in the calculation step and the candidate for the decoded data comprising the first path information and the second path information stored in the path memory step.

In one embodiment of the invention, the postcoder comprises a step of storing upper bits of the decoded data from the maximum likelihood decoding step.

In one embodiment of the invention, the maximum likelihood decoding step comprises a branch metric production step. The branch metric production step comprises referencing contents of a diagram so as to derive first path information indicating the selected path and a branch metric from the received data, wherein the contents of the diagram are obtained by associating the first series of data $Y_r, Y_{r-1}, \ldots, Y_{t-1}$, the second series of data $Y_t, Y_{t-1}, \ldots, Y_1$, and the received data, which is produced by mapping the series of data $Z_q, Z_{q-1}, \ldots, Z_1$ onto j points, with one another.

In one embodiment of the invention, the maximum likelihood decoding step comprises a branch metric production step. The branch metric production step comprises referencing contents of a diagram so as to derive first path information indicating the selected path and a branch metric from data which is obtained by passing the received data through a linear filter, wherein the contents of the diagram are obtained by associating the series of data $X_p, X_{p-1}, \ldots, X_1$ and data obtained by passing, through the linear filter, data which is produced by mapping the series of data $Z_q, Z_{q-1}, \ldots, Z_1$ onto j points, with each other.

In one embodiment of the invention, the linear filter comprises a comb filter.

In one embodiment of the invention, the maximum likelihood decoding step comprises a branch metric production step, The branch metric production step comprises referencing contents of a diagram so as to derive a candidate for the decoded data and a branch metric from the received data, wherein the contents of the diagram are obtained by associating the first series of data $Y_r, Y_{r-1}, \ldots Y_{t+1}$, the second series of data $Y_t, Y_{t-1}, \ldots, Y_1$, and the received data, which is produced by mapping the series of data $Z_q, Z_{q-1}, \ldots, Z_1$ onto j points, with one another.

In one embodiment of the invention, the maximum likelihood decoding step comprises a branch metric production step. The branch metric production step comprises referencing contents of a diagram so as to derive a candidate for the decoded data and a branch metric from data obtained by passing the received data through a linear filter, wherein the contents of the diagram are obtained by associating the series of data $X_p, X_{p-1}, \ldots, X_1$ and data obtained by passing, through the linear filter, data which is produced by mapping the series of data $Z_q, Z_{q-1}, \ldots, Z_1$ onto j points, with each other.

In one embodiment of the invention, the linear filter comprises a comb filter.

In one embodiment of the invention, the maximum likelihood decoding step comprises performing a decoding operation using a Viterbi algorithm.

Thus, the invention described herein makes possible the advantage of providing an error correction circuit for decoding encoded data without requiring a convolutional-encoding (re-encoding) operation on the encoded data.

This and other advantages of the present invention will become apparent to those skilled in the art upon reading and understanding the following detailed description with reference to the accompanying figures.

BRIEF DESCRIPTION OF THE DRAWINGS

FIG. 7 illustrates a 4-state transition diagram for the error correction circuit of FIG. 1;

FIG. 8A is a table illustrating the relationship between data $W_3W_2W_1W_0$ (15 levels) after being passed through a comb filter and data $X_2$;

FIG. 8B is a table illustrating the relationship between 15 levels after being passed through a comb filter and data $X_1$;

FIG. 9A is an 8-state transition diagram:

FIG. 9B is a table illustrating 15 levels after being passed through a comb filter:

FIG. 9C is a table illustrating level L/data $X_2X_1$ for respective branches;

FIG. 9E is a table illustrating level L/data $X_2X_1$ for respective branches;

FIG. 11A illustrates a method for calculating a branch metric for a state transition from time 0 to time 1 in FIG. 10;

FIG. 11B illustrates a method for calculating a path metric for the same state transition;

FIG. 12A illustrates a method for calculating a branch metric for a state transition from time 1 to time 2 in FIG. 10;

FIG. 12B illustrates a method for calculating a path metric for the same state transition;

FIG. 13A illustrates a method for calculating a branch metric for a state transition from time 2 to time 3 in FIG. 10;

FIG. 13B illustrates a method for calculating a path metric for the same state transition;

FIG. 14A illustrates a method for calculating a branch metric for a state transition from time 3 to time 4 in FIG. 10;

FIG. 14B illustrates a method for calculating a path metric for the same state transition;

FIGS. 15A–15C illustrate the relationship between data $W_3W_2W_1W_0$ (15 levels) according to Embodiment 1 and 7 cosets according to a conventional device;

FIG. 21A illustrates an arrangement of 64QAM encoding points according to Embodiment 2 of the present invention;

FIG. 21B illustrates an encoding point according to Embodiment 2 of the present invention;

FIG. 21C is a chart illustrating encoded bits C(3) and C(6) according to Embodiment 2 of the present invention:

DESCRIPTION OF THE PREFERRED EMBODIMENTS (Embodiment 1)

Figure 1:
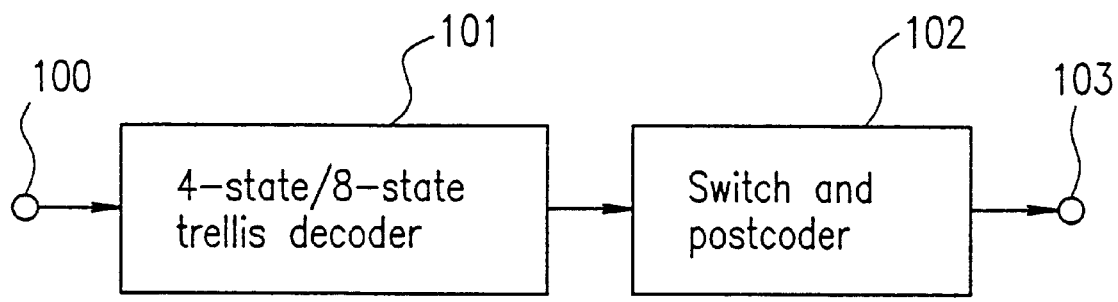
FIG. 1 is a block diagram illustrating an error correction circuit according to Embodiment 1 of the present Invention.
Figure 2:
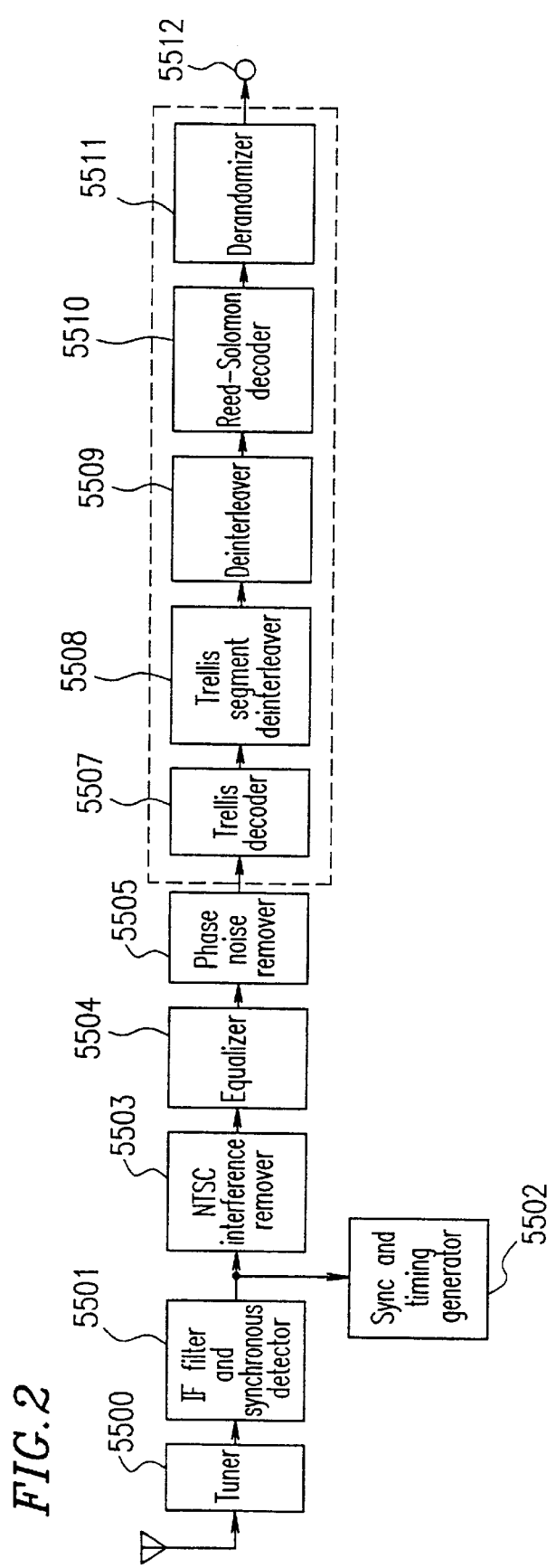
FIG. 2 is a block diagram illustrating a receiver based on an BVSB modulation system incorporating the error correction circuit of FIG. 1.

FIG. 1 is a block diagram illustrating an error correction circuit according to Embodiment 1 of the present invention. FIG. 2 is a block diagram illustrating a receiver based on the 8VSB modulation system incorporating the error "correction circuit of FIG. 1.

Referring to FIG. 2, the receiver comprises a tuner 5500, an IF filter and synchronous detector 5501, a sync and timing generator 5502, an NTSC interference remover 5503, an equalizer 5504, a phase noise remover 5505, a trellis decoder unit 5507, a trellis segment deinterleaver unit 5508, a deinterleaver 5509, a Reed-Solomon decoder 5510, a derandomizer 5511, and a terminal 5512.

The tuner 5500 tunes to and selectively receives an RF signal from a transmitter, and outputs the received signal. The IF filter and synchronous detector 5501 passes the received signal through an IF filter to convert it to a signal having a predetermined frequency, and synchronously detects the received signal to convert it to a baseband signal. The sync and timing generator 5502 detects a synchronization signal for the baseband signal so as to time the baseband signal. When the baseband signal contains an NTSC co-channel interference component, the baseband signal is input to the equalizer 5504 after the NTSC co-channel interference component is detected by the NTSC interference remover 5503 and removed by a comb filter in the NTSC interference remover 5503. When no NTSC co-channel interference component is contained, the baseband signal is directly input to the equalizer 5504. The waveform of the baseband signal is equalized by the equalizer 5504, and any phase noise contained therein is removed by the phase noise remover 5505, after which the baseband signal is input to the trellis decoder unit 5507 as encoded data. The trellis decoder unit 5507 performs a trellis decoding operation on the encoded data and outputs the trellis-decoded data. The trellis-decoded data is subjected to an in-segment deinterleave operation by the trellis segment deinterleaver unit 5508, a convolution byte deinterleave operation by the deinterleaver 5509, a Reed-Solomon decoding operation by the Reed-Solomon decoder 5510 and a derandomizing operation by the derandomizer 5511, and then output through the terminal 5512.

The error correction circuit illustrated in FIG. 1 corresponds to the trellis decoder unit 5507 in FIG. 2.

Referring to FIG. 1, the error correction circuit comprises terminals 100 and 103, a 4-state/8-state trellis decoder 101, and a switch and postcoder 102. The term "4-state/8-state trellis decoder" as used herein refers to a trellis decoder which is used commonly for 4-state transition and for 8-state transition.

The encoded data from the phase noise remover 5505 of FIG. 2 is input through the terminal 100. The 4-state/8-state trellis decoder 101 decodes the encoded data and outputs the decoded data. The switch and postcoder 102 performs a postcoding operation on the decoded data, when no NTSC co-channel interference component is contained (for 4-state transition). The switch and postcoder 102 does not perform a postcoding operation on the decoded data, and the decoded data is directly output to the terminal 103, when an NTSC co-channel interference component is contained (for 8-state transition).

Figure 24:
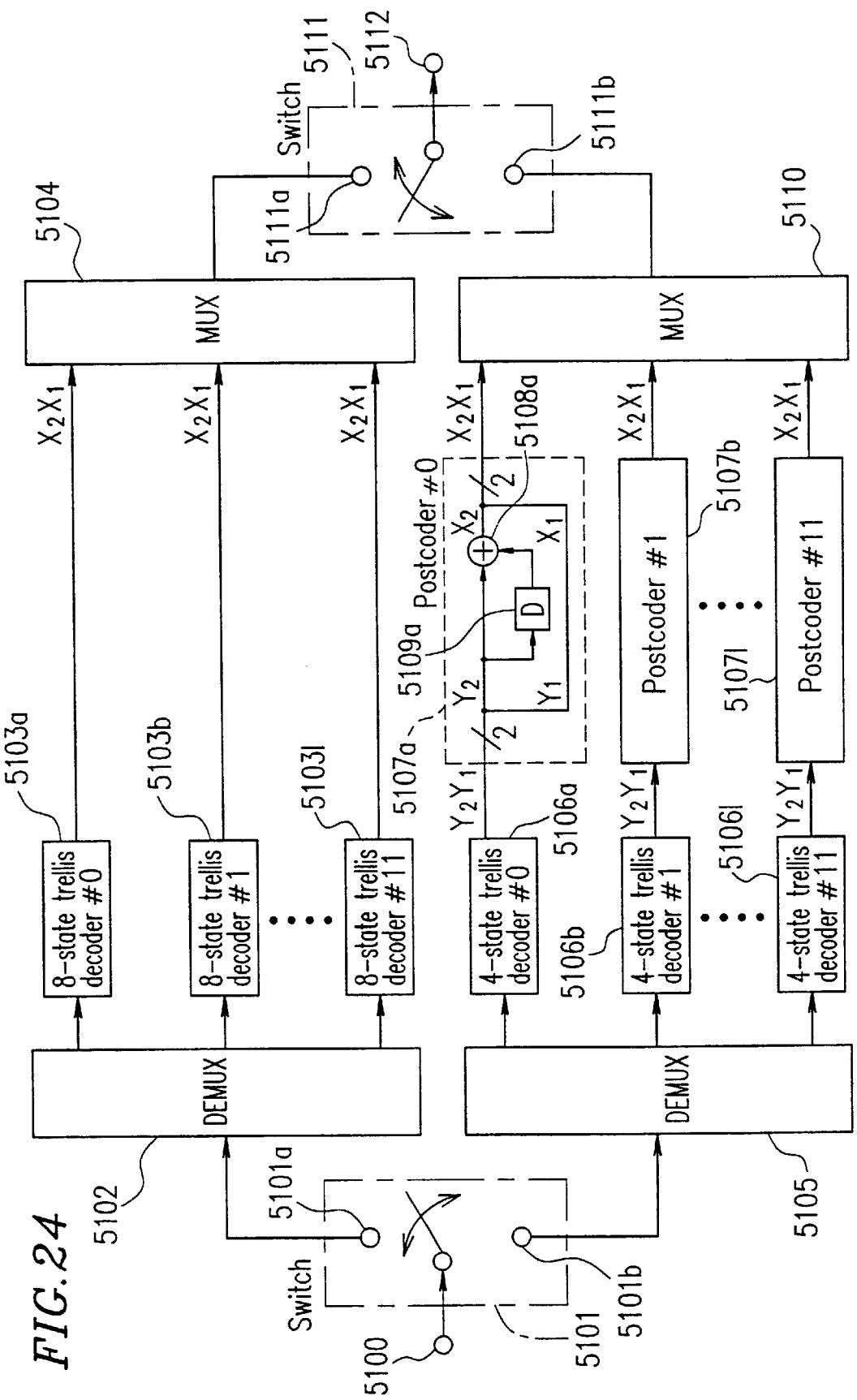
FIG. 24 is a block diagram illustrating a conventional trellis decoder which decodes data by selectively using a 4-state trellis decoder and an 8-state trellis decoder.
Figure 25:
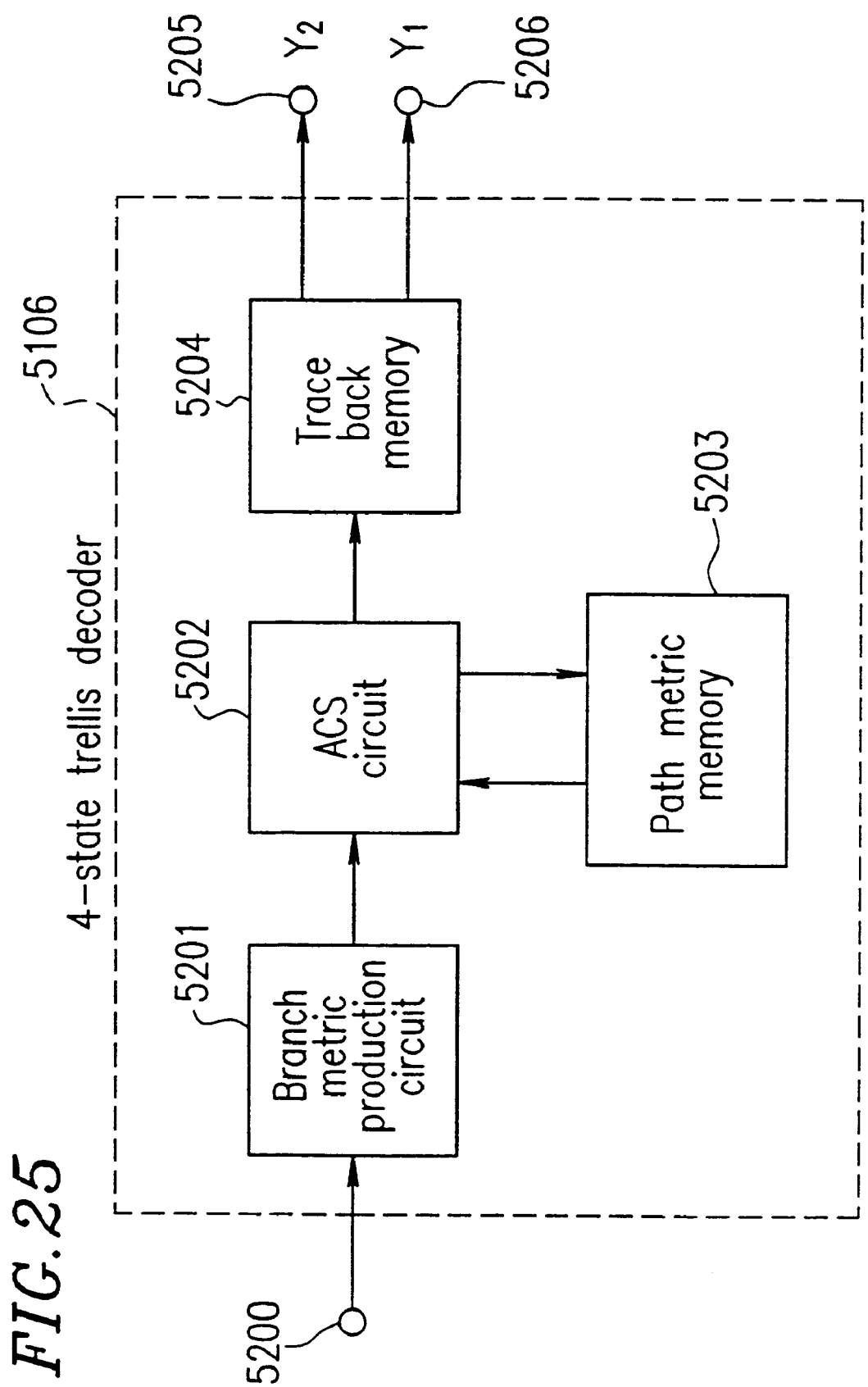
FIG. 25 is a block diagram illustrating a conventional 4-state trellis decoder.

The circuit according to Embodiment 1 of the present invention requires only one 4-state/8-state trellis decoder 101 and only one switch and postcoder 102, thereby significantly reducing the circuit scale from that of the conventional device illustrated in FIG. 24 which comprises a plurality of trellis decoders and a plurality of postcoders.

Figure 3:
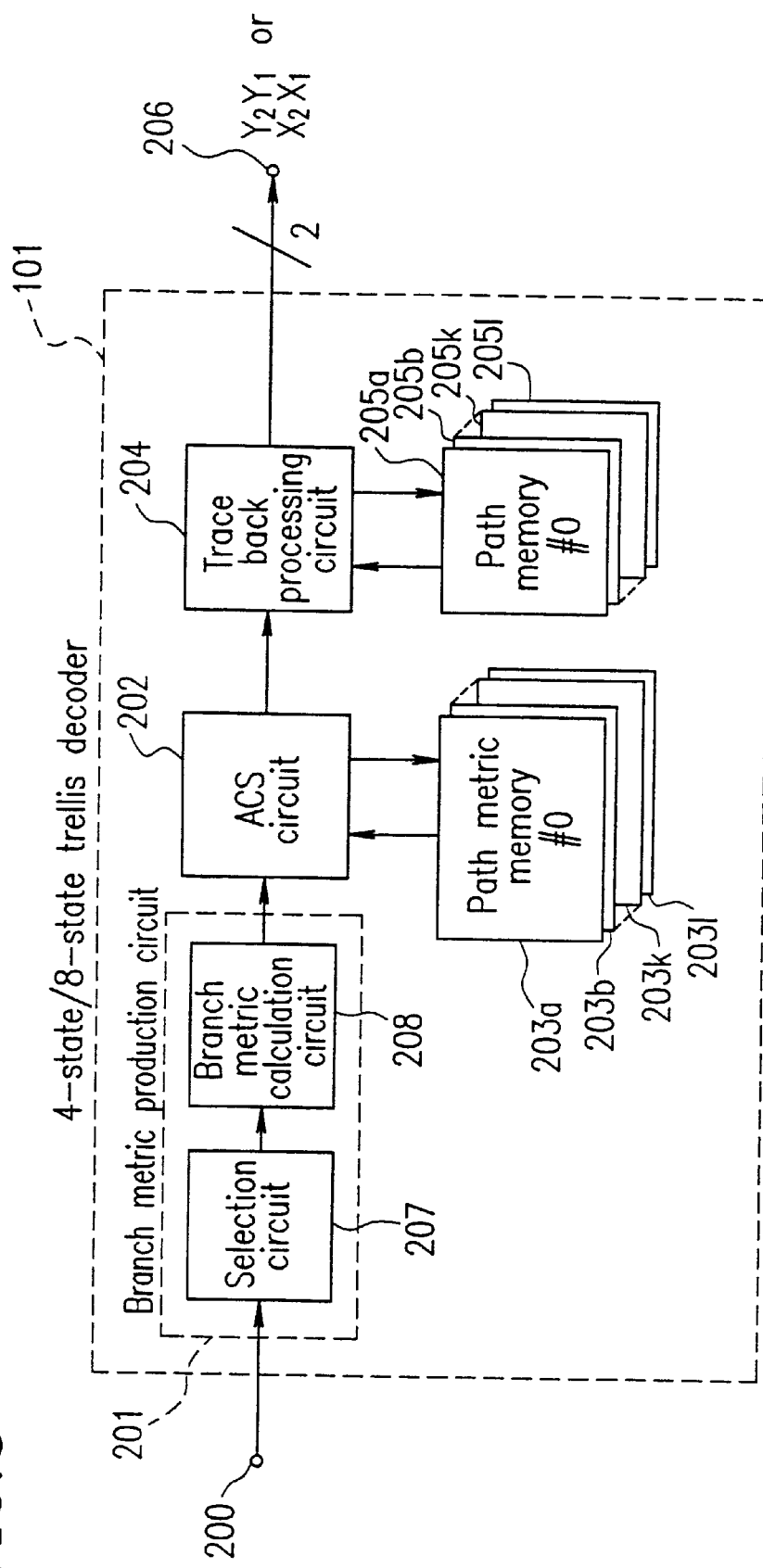
FIG. 3 is a block diagram illustrating a 4-state/8-state trellis decoder provided in the error correction circuit of FIG. 1.

FIG. 3 illustrates the 4-state/8-state trellis decoder 101. Referring to FIG. 3, the 4-state/8-state trellis decoder 101 comprises terminals 200 and 206, a branch metric production circuit 201, an ACS circuit 202, path metric memories 203a–203l, a trace back processing circuit 204, and path memories 205a–205l.

The branch metric production circuit 201 comprises a selection circuit 207 and a branch metric calculation circuit 208.

Figure 4:
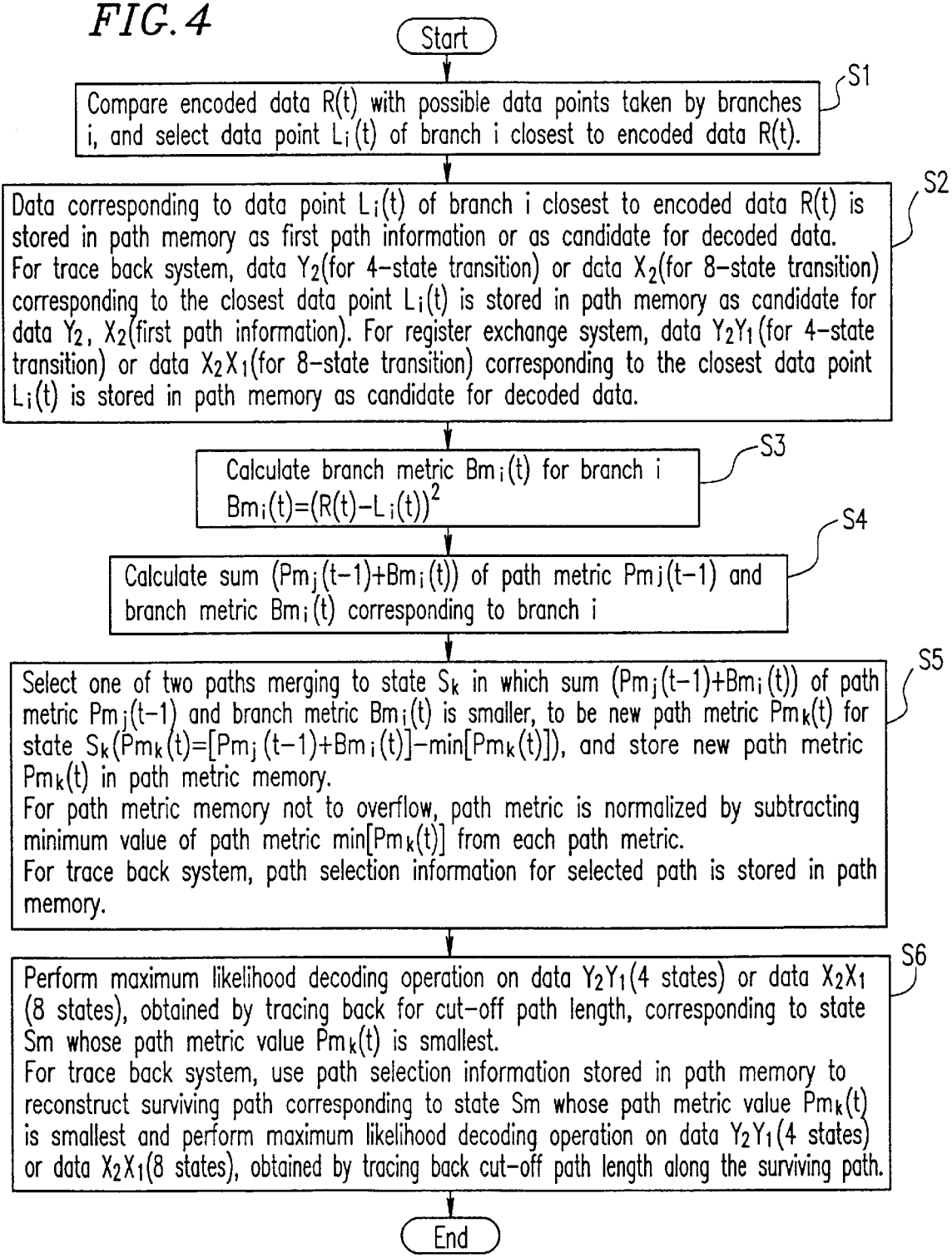
FIG. 4 is a flow chart illustrating a decoding process by the 4-state/8-state trellis decoder of FIG. 3.

The encoded data from the phase noise remover 5505 of FIG. 2 is input to the terminal 200. The 4-state/8-state trellis decoder 101 decodes the encoded data using a Viterbi algorithm. The decoding process will be described below with reference to the flow chart of FIG. 4 .

There are two (for 4-state transition) or three (for 8-state transition) possible parallel paths from state $S_1$ at time t (t is an integer) to state $S_k$ at time t+1. There are two possible state transitions to state $S_k$ at time t+1 (i.e., one from state $S_i$ at time t and another from state $S_j$ at time t). The selection circuit 207 compares the encoded data with possible data points taken by each of the branches (i.e., one from state $S_i$ to state $S_k$ and another from state $S_j$ to state $S_k$), and selects one of the possible data points taken by the branches which is closest to the encoded data (step S1), so as to produce a candidate for data $Y_2$ (first path information for 4-state transition) or a candidate for data $X_2$ (first path information for 8-state transition). The candidates for data $Y_2$ and data $X_2$ are stored in a path memory (one of the path memories 205a–205l) (step S2). For a register exchange system, a candidate for data $Y_2Y_1$ (a candidate for decoded data for 4-state transition) or a candidate for data $X_2X$, (a candidate for decoded data for 8-state transition) is produced and stored in the path memory.

The branch metric calculation circuit 208 calculates a branch metric for the parallel path closest to the encoded data (step S3). A square of Euclidean distance is used for the branch metric. The branch metric production circuit 201 produces a branch metric for each branch for each encoded data and a candidate for data $Y_2$ (first path information for 4-state transition) or a candidate for data $X_2$ (first path information for 8-state transition), and outputs them to the ACS circuit 202. For a register exchange system, a candidate for data $Y_2Y_1$ (a candidate for decoded data for 4-state transition) or a candidate for data $X_2X_1$ (a candidate for decoded data for 8-state transition) is produced and output to the ACS circuit 202.

The ACS circuit 202 adds the branch metric for each branch to the path metric for each state stored in the path metric memory (one of the path metric memories 203a–203l) (step S4), so as to compare the obtained sums with each other and select the smallest sum to be a new path metric for the state. The new path metrics for the respective states are stored in the above-described path metric memory (one of path metric memories 203a–203l) (step S5). Data corresponding to the selected path for each state (path selection information (second path information)) is stored in the path memory (one of the path memories 205a–205l) having a number corresponding to that of the path metric memory. The trace back processing circuit 204 traces back a predetermined cut-off path length along a surviving path which contains a state whose new path metric is smallest so as to determine data $Y_2Y_1$ (for 4-state transition) or data $X_2X_1$ (for 8-state transition), and the determined data is output to the terminal 206 (step S6).

The path metric memories 203a–203l and the path memories 205a–205l, along with 1-symbol delay circuits 306a–306l of a postcoder 302 (described later), are successively selected in the same order according to a trellis encoding rule of the trellis encoder unit 5006 of FIG. 22.

However, during the segment sync period (in which the data is not trellis-encoded), no encoded data is input to the 4-state/8-state trellis decoder 101, while memory selections are switched to the next one of the path metric memories 203a–203l and to the next one of the path memories 205a–205l, respectively.

As described above, the 4-state/8-state trellis decoder 101 is provided with the path metric memories 203a–203l and the path memories 205a–205l so that each path metric memory stores the path metric for each state and that each path memory stores data for each state (i.e., the first path information and the second path information (for the trace back system), or a candidate for decoded data (for the register exchange system)). Thus, it is possible to repeatedly and successively perform the 4-state and 8-state decoding operations. The use of the 4-state/830 state trellis decoder 101 makes it possible to implement the error correction circuit of FIG. 1.

Figure 5:
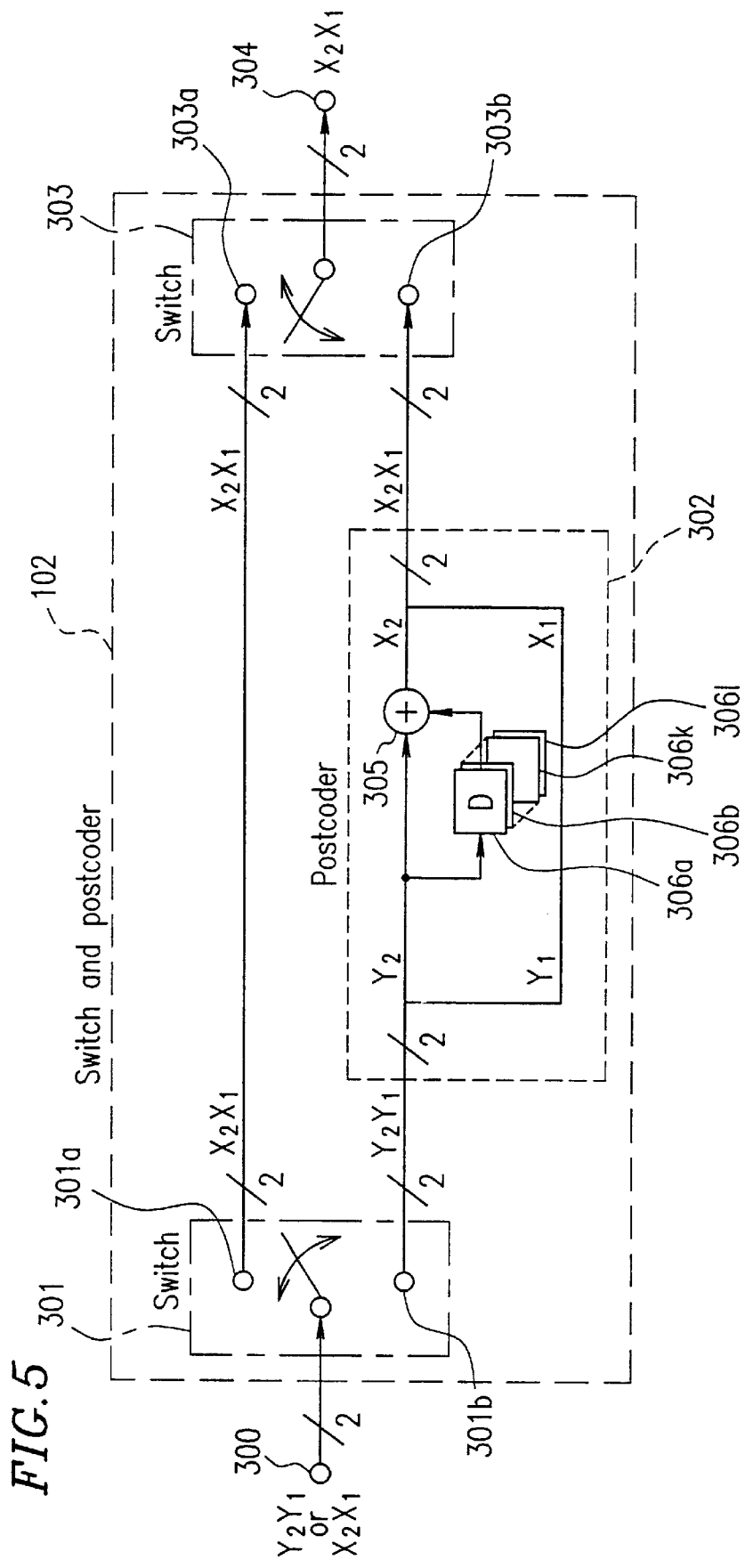
FIG. 5 is a block diagram illustrating a switch and postcoder provided in the error correction circuit of FIG. 1.

FIG. 5 illustrates in greater detail the switch and postcoder 102. Referring to FIG. 5, the switch and postcoder 102 comprises terminals 300 and 304, switches 301 and 303, further terminals 301a, 301b, 303a and 303b, the postcoder 302, the adder 305 (modulo 2), and the 1-symbol delay circuits 306a–306l.

The decoded data from the 4-state/8-state trellis decoder 101 is input to the terminal 300. The switch 300 is turned to the terminal 301a when an NTSC co-channel interference component is contained (for 8-state transition), and to the terminal 301b when no NTSC co-channel interference component is contained (for 4-state transition). When the terminal 301b is selected, the postcoder 302 passes data $Y_2$ through a feed forward loop to convert it to data $X_2$, and outputs the decoded data $X_2X_1$.

The switch 303 is turned to the terminal 303a when an NTSC co-channel interference component is contained, and to the terminal 303b when no NTSC co-channel interference component is contained, so that data $X_2X_1$ is output to the terminal 304.

Figure 22:
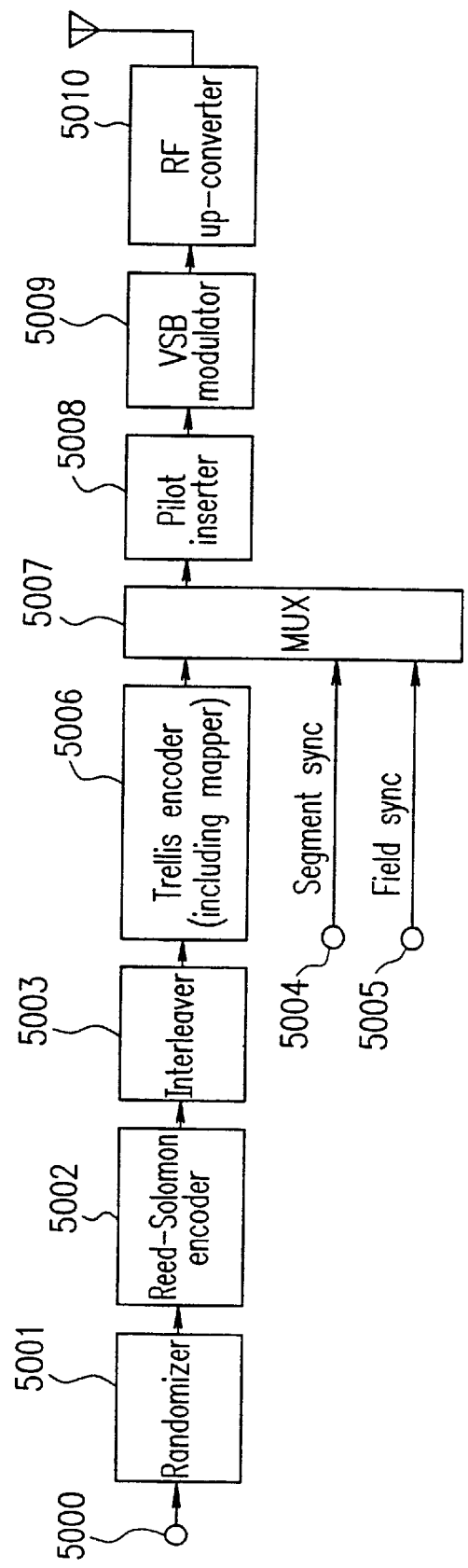
FIG. 22 is a block diagram illustrating a conventional transmitter based on the 8VSB modulation system.
Figure 23:
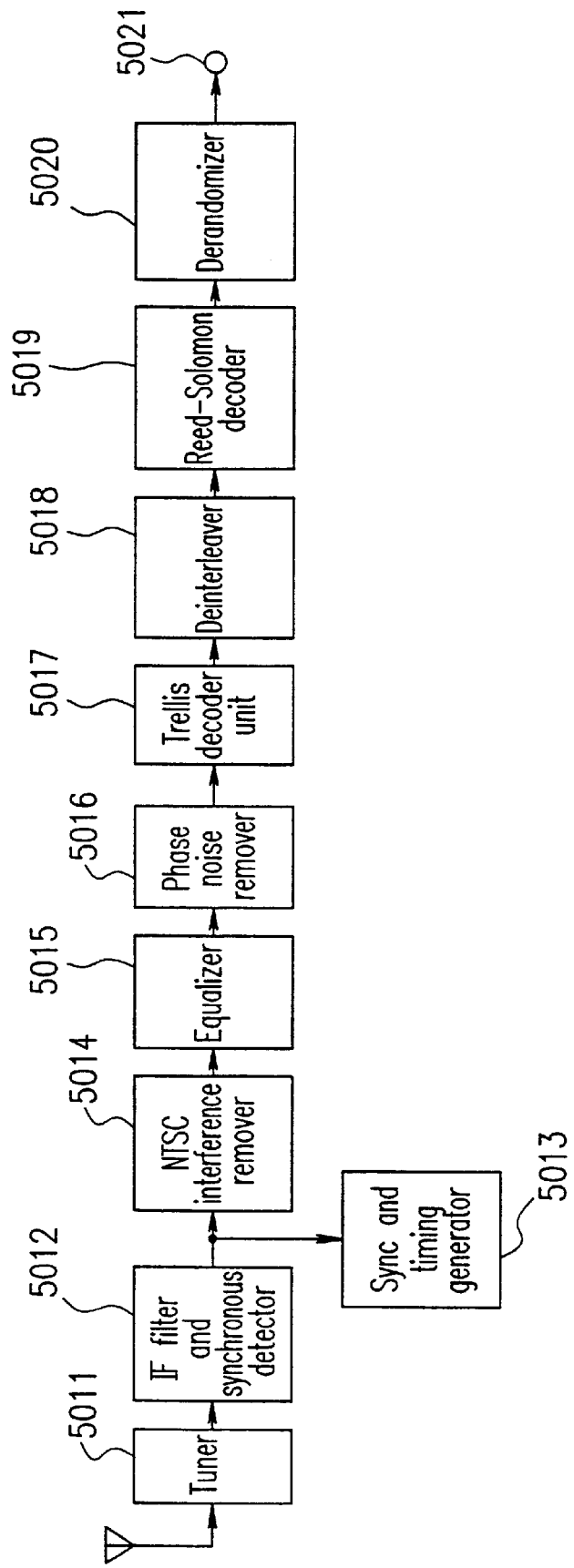
FIG. 23 is a block diagram illustrating a conventional receiver based on the OVSB modulation system.

The 1-symbol delay circuits 306a–306l, along with the path metric memories 203a–203l and the path memories 205a–205l, are successively selected in the same order according to a trellis encoding rule of the trellis encoder unit 5006 of FIG. 22.

However, during the segment sync period (In which the data is not trellis-encoded), no decoded data is input to the switch and postcoder 102, while delay circuit selection is switched to the next one of the 1-symbol delay circuits 306a–306l.

As described above, the switch and postcoder 102 is provided with the 1-symbol delay circuits 306a–306l, and data $Y_2$ for 4-state transition is stored in each of the path metric memories 203a–203l and the path memories 205s–205l. Thus, it is possible to repeatedly and successively perform the 4-state and 8-state decoding operations. The use of the switch and postcoder 102 makes it possible to implement the error correction circuit of FIG. 1.

Next, the contents of the state transition diagram used in the 4-state/8-state trellis decoder 101 for decoding the encoded data will be described in detail.

Figure 6:
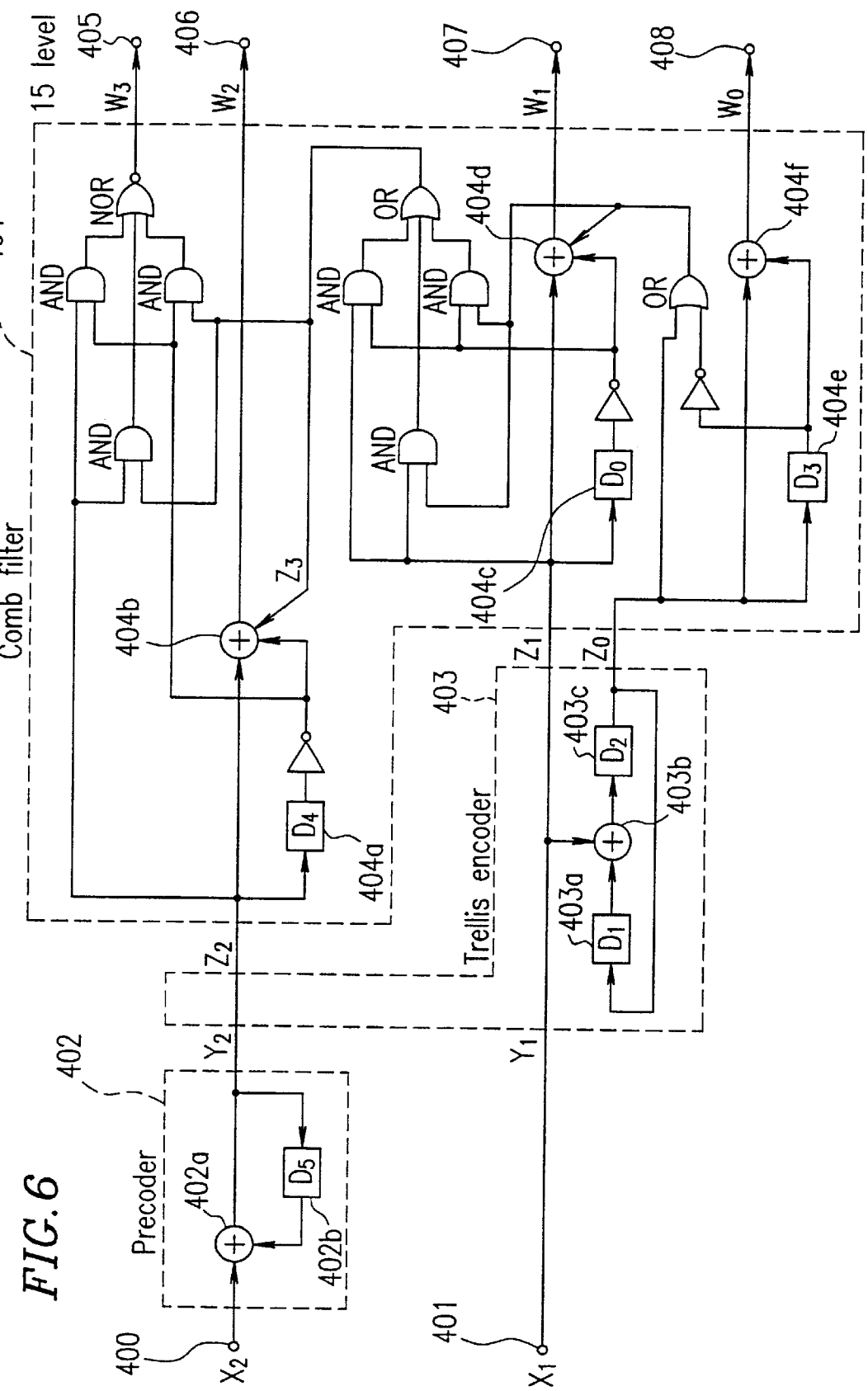
FIG. 6 is a block diagram illustrating a circuit configuration for producing the contents of a state transition diagram for the error correction circuit of FIG. 1.

FIG. 6 is a block diagram illustrating a circuit configuration for producing the contents of the state transition diagram. Referring to FIG. 6, the circuit comprises, terminals 400, 401, 405, 406, 407 and 408, a precoder 402, adders (module 2) 402a, 403b, 404b, 404d and 404f, 1-symbol delay circuits 402b, 403a, 403c, 404a, 404c and 404e, a trellis encoder 403, and a comb filter 404.

In the circuit illustrated in FIG. 6, the delay circuits provided in the precoder 402, the trellis encoder 403, and the comb filter 404 are all 1-symbol delay circuits for delaying information by 1 bit. The upper bit $X_2$ of the 2-bit input data $X_2X_1$ is input to the terminal 400, with the lower bit $X_1$ ($X_1=Y_1$) thereof being input to the terminal 401. The precoder 402 precedes data $X_2$ to obtain data $Y_2$ ($Y_2=Z_2$). The trellis encoder 403 performs a trellis encoding operation on data $Y_2Y_1$ to obtain data $Z_2Z_1Z_0$. For the case where there is NTSC co-channel interference, it can be considered that a comb filter used on the receiving side is provided on the transmitting side. Then, data $Z_2Z_1Z_0$ is passed through the comb filter 404 to obtain data $W_3W_2W_1W_0$ (15 levels). The $D_1$ and $D_0$ are the same delayed information, and $D_4$ and $D_5$ are also the same delayed information (i.e., $D_0=D_3$, $D_4=D_5$).

FIG. 7 is a 4-state transition diagram. Referring to FIG. 7, $S_0$, $S_1$, $S_2$, and $S_3$ each denote a state, $D_1$ and $D_2$ denote delayed information of the delay circuits 403a and 403c of FIG. 6, respectively, and $R/Y_2Y_1$ denotes symbol/data, For 4-state transition, there are two paths (−7/00 and +1/10) for the transition from state $S_0$ to state $S_0$, as illustrated in the figure. One of the two paths is selected based on the received signal level.

For 4-state transition, data $Y_2Y_1$ is decoded using the state transition diagram of FIG. 7.

FIG. 8A is a table illustrating the relationship between data $W_3W_2W_1W_0$ (15 levels) after being passed through the comb filter and data $X_2$. FIG. 8B is a table illustrating the relationship between the 15 levels after being passed through the comb filter and data $X_1$.

Referring to FIG. 8A, it can be seen that $Y_2$ cannot be uniquely determined from $W_3W_2Z_3$ (see FIG. 6), but $X_2$ can be uniquely determined therefrom. $Z_3$ is determined simultaneously with $W_1$ and $W_0$ which are determined by the trellis encoder 403 and the comb filter 404. Thus, referring to FIG. 6, input data $X_2X_1$ can be determined from $W_3W_2W_1W_0$ by the trellis decoder 101 (FIG. 1).

FIG. 9A is an 8-state transition diagram. FIG. 9B is a table illustrating the 15 levels after being passed through the comb filter. FIG. 9C is a table illustrating level L/Data $X_2X_1$ for each branch. In FIGS. 9A–9C, $S_0$, $S_1$, $S_2$, $S_3$, $S_4$, $S_5$, $S_6$ and $S_7$ each denote a state, $D_1$, $D_2$ and $D_3$ denote delayed information of the delay circuits 404c, 403a and 403c of FIG. 6, respectively, and L/$X_2X_1$ denotes level/data.

Figure 9D:
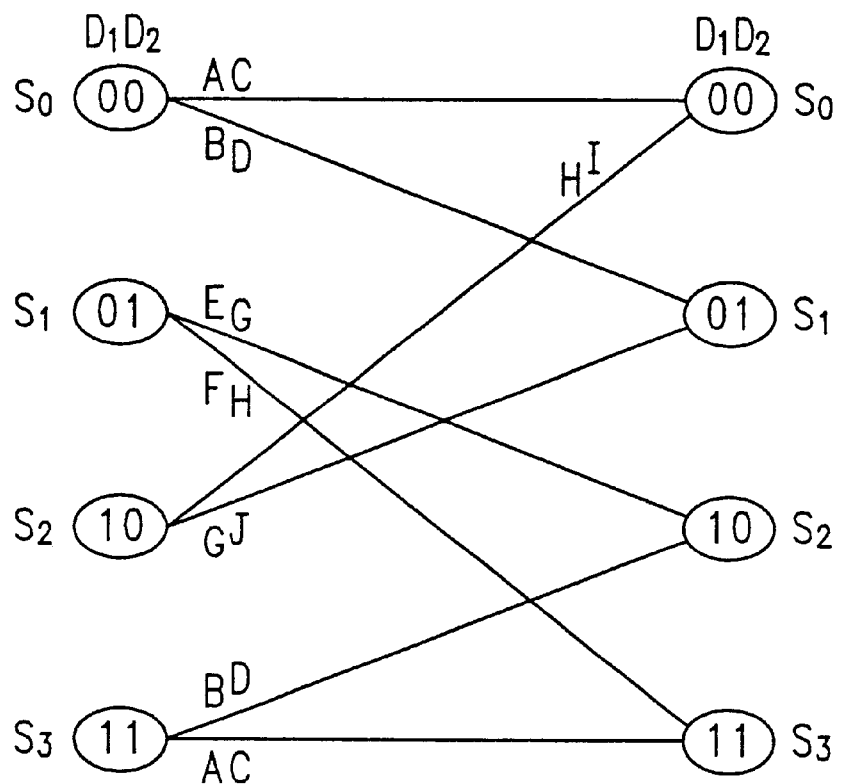
FIG. 9D is a state transition diagram used commonly for 8-state transition and for 4-state transition.

Without $D_0$ (considering only $D_1$ and $D_2$), the state transition of FIG. 9A becomes equivalent to the 4-state transition of FIG. 7 but with the number of parallel paths being increased from two to three. This is shown in FIGS. 9D and 9E. As can be seen from FIGS. 9D and 9E, there are three paths ((−12, −8/10), (−4, 0/00), (4, 8/10)) from state $S_0$ to state $S_0$, for example. One of the three paths is selected based on the received signal level. Thus, it is possible to use a trellis decoder commonly for 4-state transition and for 8-state transition.

Next, an exemplary trellis decoding process by the error correction circuit of Embodiment 1 based on the 8-state transition as illustrated in FIGS. 9A–9C will be described with reference to FIGS. 10–15C.

Figure 10:
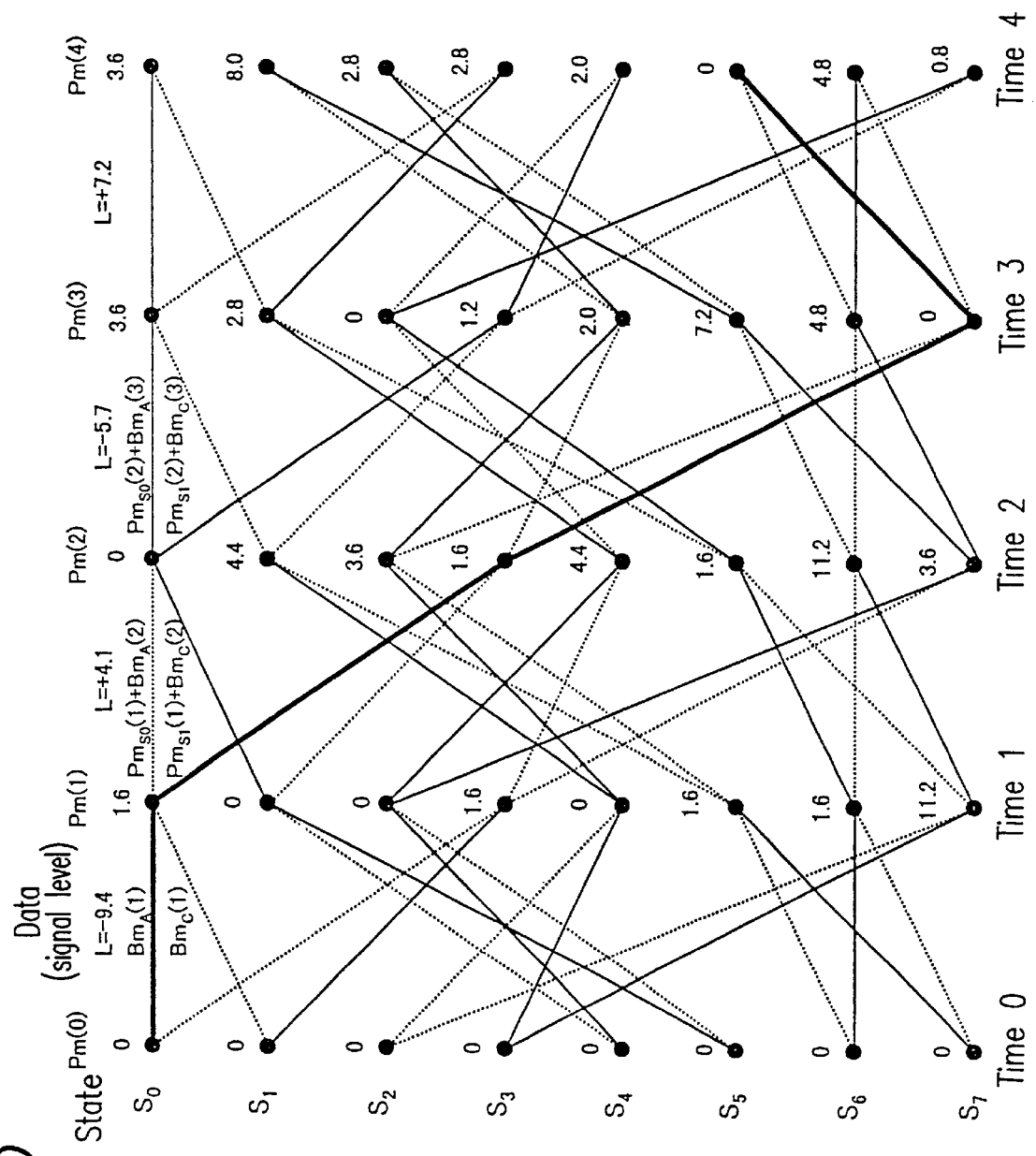
FIG. 10 is a trellis diagram illustrating 8-state transitions.

FIG. 10 is a trellis diagram illustrating 8-state transitions. In FIG. 10, each state has one surviving path (indicated by a solid line).

FIGS. 11A–14B illustrate a method for calculating a branch metric and a path metric for a state transition from time t (t is an integer) to time t+1 in FIG. 10.

FIGS. 15A–15C illustrate the relationship between data $W_3W_2W_1W_0$ (15 levels) according to Embodiment 1 and 7 cosets according to the conventional device. As is apparent from FIGS. 15A–15C, it is possible to perform the decoding operation using the 15 levels as in Embodiment 1 which is substantially the same as that of the conventional device using cosets.

The relationship between the 15 levels of Embodiment 1 and the 7 cosets of the conventional device is also illustrated in the tables of FIGS. 11A, 12A. 13A and 14A.

The calculation of branch metrics and path metrics for the state transition from time t to time t+1 of FIG. 10 will be described. For example, consider a case where the received signal level after being passed through the comb filter varies from −9.4, to +4.1, −5,7, and then to +7.2. In this example, state transitions after time 0 is considered, and therefore the path metric Pm(0) at time 0 is 0 for each state. The path metric Pm(t+1) at time t+1 is the sum of the path metric Pm(t) at time t and the branch metric Bm(t+1) at time t+1. Thus, Pm(t+1)=Pm(t)+Bm(t+1).

First, the branch metric and the path metric for the state transition from time 0 to time 1 in FIG. 10 are calculated. The two branches (2×3=6) transiting to state $S_0$ at time 1 are considered. There are two state transitions to state $S_0$ at time 1 (i.e., one from state $S_0$ at time 0 and another from state $S_1$ at time 0).

Three signal levels −8, 0 and +8 may be taken by the transition branch from state $S_0$ at time 0 to state $S_0$ at time 1. Of the three signal levels, the signal level −8 which is closest to the received signal level −9.4 (indicated by "L=" in FIG. 10) is selected. Then, the branch metric for the transition is calculated as follows:

$$B_{mA}(1)-(-9.4-(-8))^2=1.96$$

Therefore, the path metric for the path is calculated as follows:

$$P_{mS0}(0)+B_{mA}(1)=0+1.96=1.96$$

Similarly, three signal levels −12, −4 and +4 may be taken by the transition branch from state $S_1$ at time 0 to state $S_0$ at time 1. Of the three signal levels, the signal level −12 which is closest to the received signal level −9.4 is selected. Then, the branch metric for the transition is calculated as follows:

$$B_{mC}(1)=(-9.4-(-12))^2=6.76$$

Therefore, the path metric for the path is calculated as follows:

$$P_{rmS1}(0)+B_{mC}(1)=0+6.76=6.76$$

$P_{S0}(0)+B_{mA}(1)$ and $P_{mS1}(0)+B_{mC}(1)$ are compared with each other. Since $P_{mS0}(0)+B_{mA}(1)$ is the smaller value, the path metric $P_{mS0}(1)$ for state $S_0$ at time 1 is calculated as follows:

$$P_{mS0}(1)=(P_{mS0}(0)+B_{mA}(1))-0.36 =B_{mA}(1)-0.36=1.96-0.36=1.6$$

The path metric Pm(t) at time t is normalized so that the minimum value of the path metric is 0.

The branch metrics and the path metrics for the other states at time 1 are also calculated as described above and as illustrated in FIGS. 11A and 11B. The symbols A-J in $B_{mA}(1)$–$E_{mJ}(1)$ respectively correspond to the symbols A-J provided to the branches in FIGS. 9A, 9C, 15A and 15C. Thus, $B_{mA}(1)$–$B_{mJ}(1)$ are the branch metrics for the branches A-J.

The branch metrics and the path metrics for the other state transitions from time t to time t+1 are similarly calculated as illustrated in FIGS. 12A–14B.

Referring to FIG. 10, and assuming the cut-off path length to be 4, for example, the path metric at time 4 is smallest for state $S_5$. Then, the most likely state at time 0 is state $S_0$ as determined by tracing back the predetermined cut-off path length (−4) along the surviving path. Therefore, the most likely path for the transition from time 0 to time 1 is the path from state $S_0$ to state $S_0$. Thus, the maximum-likelihood-decoded data $X_2X_1$ is "10" (the branch is associated with data $X_2X_1$ as illustrated in FIG. 9C). It is currently believed in the art that the cut-off path length is preferably about 5–6 times of the constraint length (i.e., 4×5 to 4×6=20 to 24 for 8-state transition), while the cut-off path length is set to be 32 for both 4-state transition and 8-state transition in Embodiment 1 allowing for desirable decoding operations. According to Embodiment 1, a candidate for data $X_2$ (first path information) and selection information (second path information) are stored in the path memory and a maximum likelihood decoding operation is performed on data $X_2X_1$ for the trace back system, whereas a candidate for data $X_2X_1$ (a candidate for decoded data) is stored in the path memory and a maximum likelihood decoding operation is performed on data $X_2X_1$ for the register exchange system. While a case of 8-state transition has been described above, a process substantially the same as that for 8-state transition can be used for 4-state transition to perform a maximum likelihood decoding operation on data $Y_2Y_1$.

Figure 26:
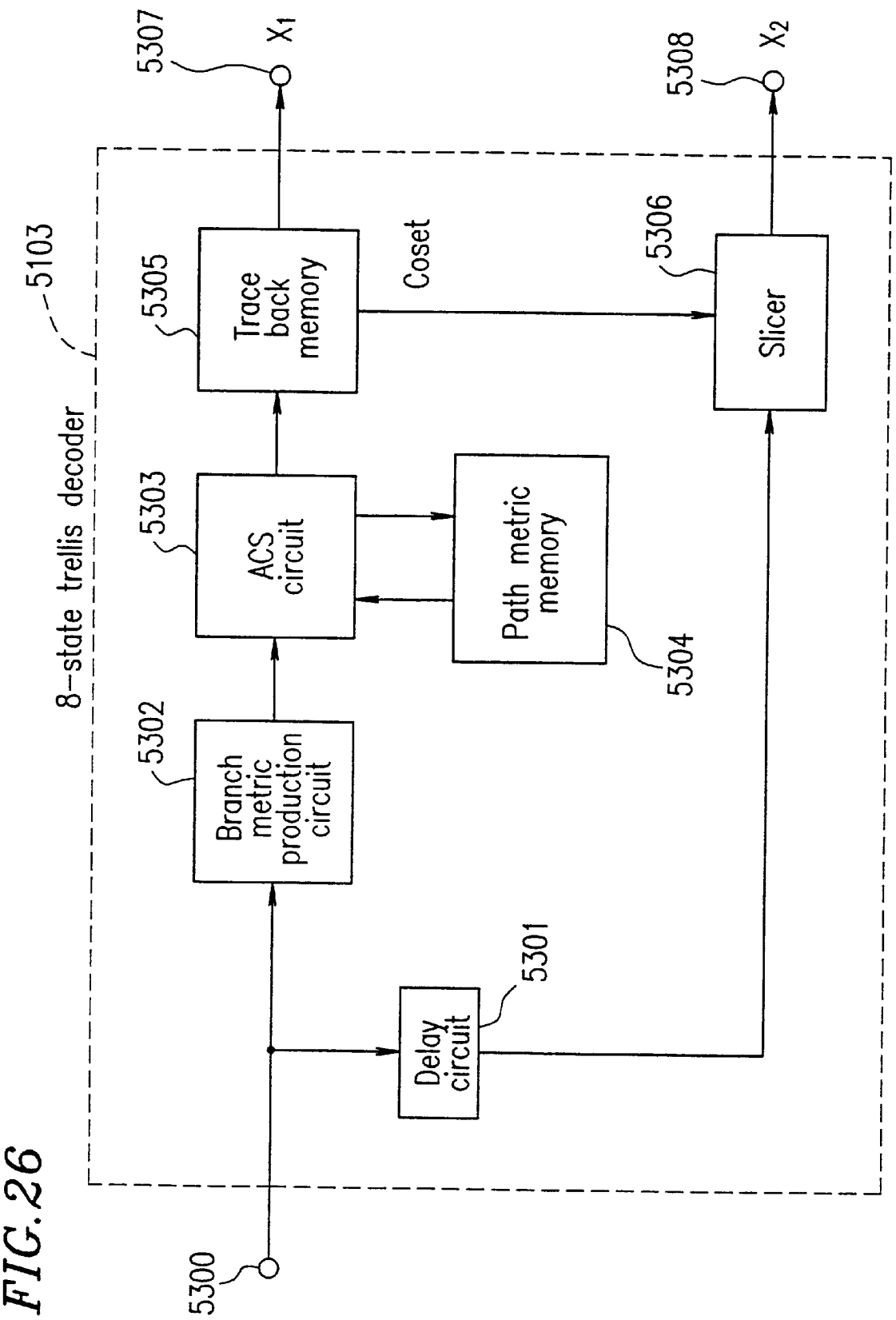
FIG. 26 is a block diagram illustrating a conventional 8-state trellis decoder.
Figure 27:
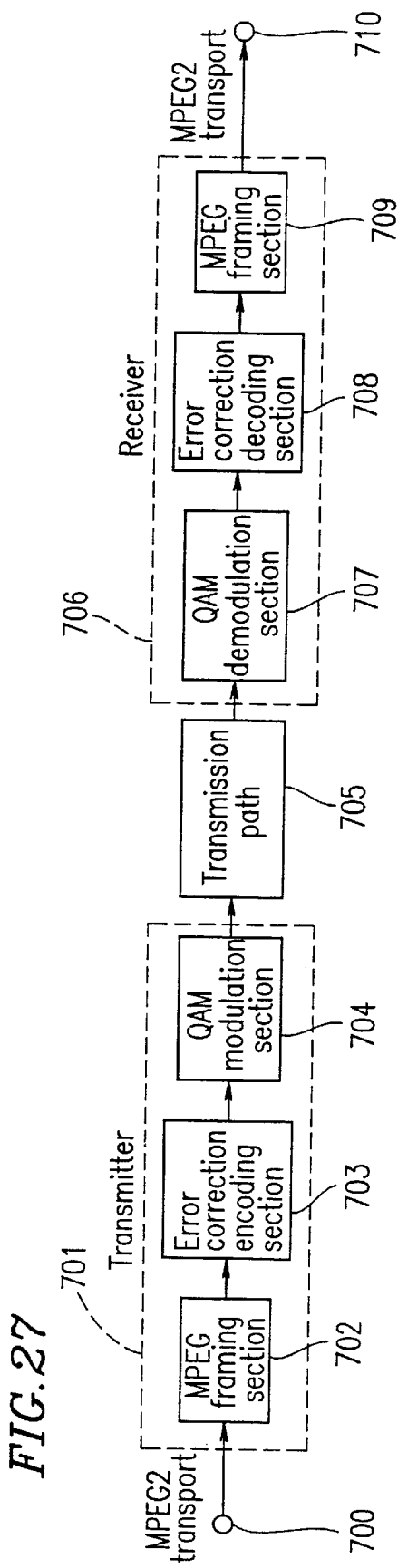
FIG. 27 is a block diagram illustrating a transmitter and a receiver of a conventional digital CATV.

On the contrary, when using the conventional 8-state trellis decoder illustrated in FIG. 26, the most likely path for the transition from time 0 to time 1 is the path from state $S_0$ to state $S_0$ as determined by tracing back the predetermined cut-off path length along the surviving path from state $S_5$ at time 4. Thus, a maximum likelihood decoding operation is performed to obtain data $X_1$="0" and coset UA="−8, 0, +8". The maximum-likelihood-decoded coset UA"−8, 0, +8" is used by the slicer 5306 for a decoding operation to obtain data $X_2$"1". Thus, the prior art requires the delay circuit 5301 and the slicer 5306.

As described above, according to the embodiment of the present invention, it is possible to use a trellis decoder commonly for 4-state transition and for 8-state transition, and to directly decode data $X_2x$, by using the 8-state transition diagram.

While the trace back processing circuit 204 is used in Embodiment 1 as the 4-state/8-state trellis decoder 101, a register exchange circuit may alternatively be used in place of the trace back processing circuit 204. Moreover, while a square of Euclidean distance is used in Embodiment 1 for the branch metric, any other suitable value can alternatively be used, e.g., an absolute value of Euclidean distance.

As described above, according to Embodiment 1 of the present invention, the branch metric production circuit 201 first compares the encoded data with possible data points taken by each of the branches (i.e., one from state $S_1$ to state $S_k$ and another from state $S_j$ to state $S_k$) to select one of the data points closest to the encoded data, and a candidate for data $X_2$ (first path information for the trace back system) or a candidate for data $X_2X_1$ (a candidate for the decoded data for the register exchange system) is produced so as to calculate the branch metric for the data closest to the encoded data. Alternatively, all the squares of Euclidean distance for the encoded data and possible data points taken by each of the branches (i.e., one from state $S_1$ to state $S_k$ and another from state $S_1$ to state $S_k$) may be first calculated, so as to use the smallest square value as the branch metric for that branch, thereby using the data corresponding to the branch metric as a candidate for data $X_2$ (first path information for the trace back system) or a candidate for data $X_2X_1$ (a candidate for the decoded data for the register exchange system). While a plurality of memories are used for each of the path metric memory and the path memory of the 4-state/8-state trellis decoder 101 and for the 1-symbol delay circuit of the postcoder 302, a single memory or a shared memory may alternatively be used, and the memory may be divided into a plurality of memory areas.

As described above, the error correction circuit of Embodiment 1 does not require the slicer 5306 of the conventional device illustrated in FIG. 26 and does not perform the convolution operation, thereby avoiding the possibility of error propagation.

When using an 8-state trellis decoder, the conventional device requires 4 bits of information (a candidate for a coset (3 bits) and a candidate for data $X_1$ (1 bit)) to be stored for each state in the trace back memory 5305, while the error correction circuit of Embodiment 1 only requires 2 bits of information (a candidate for data $X_2$ (1 bit) and path selection information (information corresponding to a candidate for data $X_1$ (1 bit)) to be stored for each state in the path memory. Therefore, the error correction circuit of Embodiment 1 only requires a memory capacity which is ½ (2 bits/4 bits=½) of that required for the conventional device. Thus, the memory capacity required for the error correction circuit of Embodiment 1 is reduced by 50% from that required for the conventional device.

Moreover, the conventional device requires the delay circuit 5301 illustrated in FIG. 26. For example, in order to delay 10 bits of information by the delay circuit 5301, (4×8+10) bits need to be stored. On the contrary, Embodiment 1 only requires (2×8) bits to be stored. Therefore, the error correction circuit of Embodiment 1 only requires a memory capacity which is about 0.4 times ((2×8)/(4×8+10)= 16/42=0.4) of that required for the conventional device. Thus, the memory capacity required for the error correction circuit of Embodiment 1 is reduced by about 60% from that required for the conventional device.

Furthermore, for the entire 8-state trellis decoder, the error correction circuit of Embodiment 1 only requires a memory capacity which is about 0.6 times ((1+1)/(1+42/16)=0.6) of that required for the conventional device. Thus, the memory capacity required for the error correction circuit of Embodiment 1 is reduced by about 40% from that required for the conventional device.

(Embodiment 2)

Figure 16:
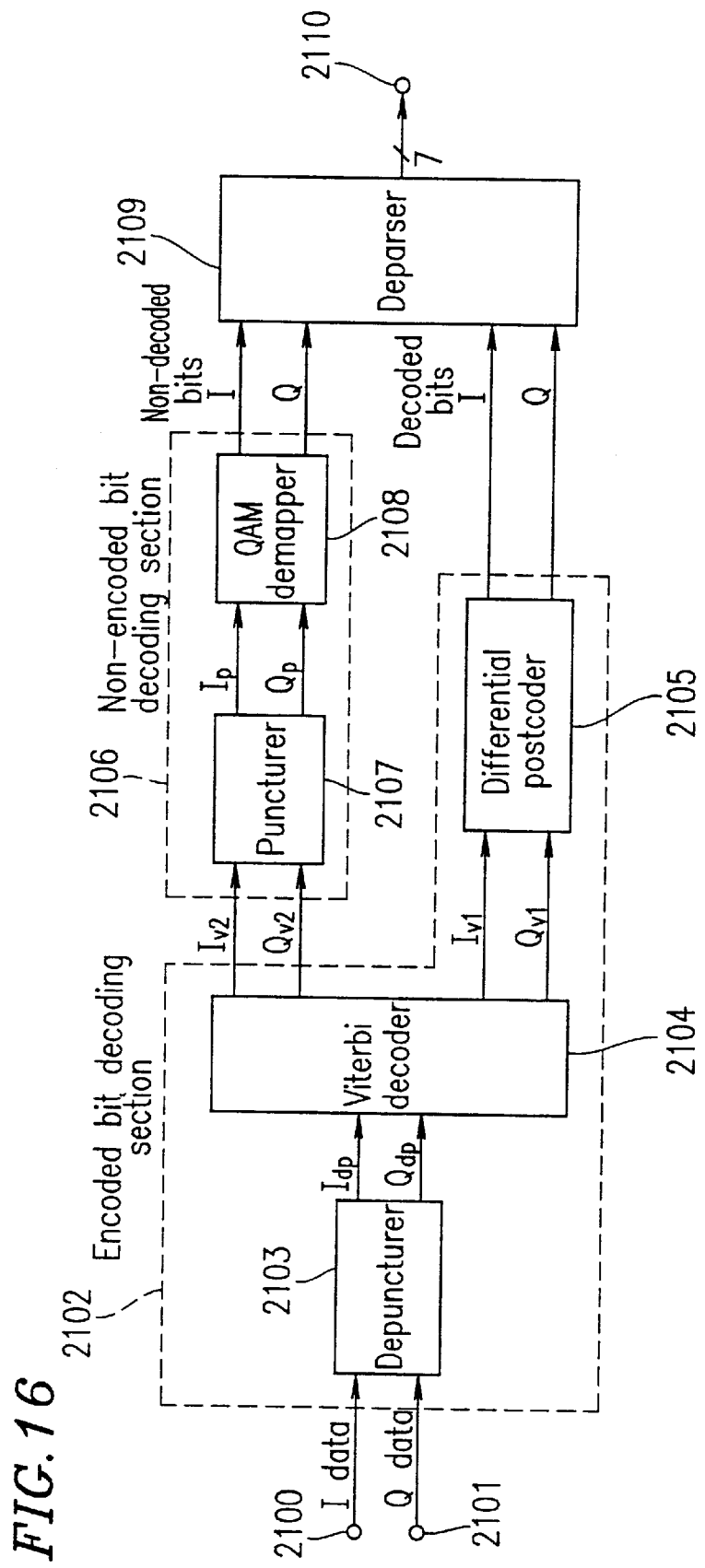
FIG. 16 is a block diagram illustrating a trellis decoder and a deparser of an error correction circuit according to Embodiment 2 of the present invention.
Figure 28A:
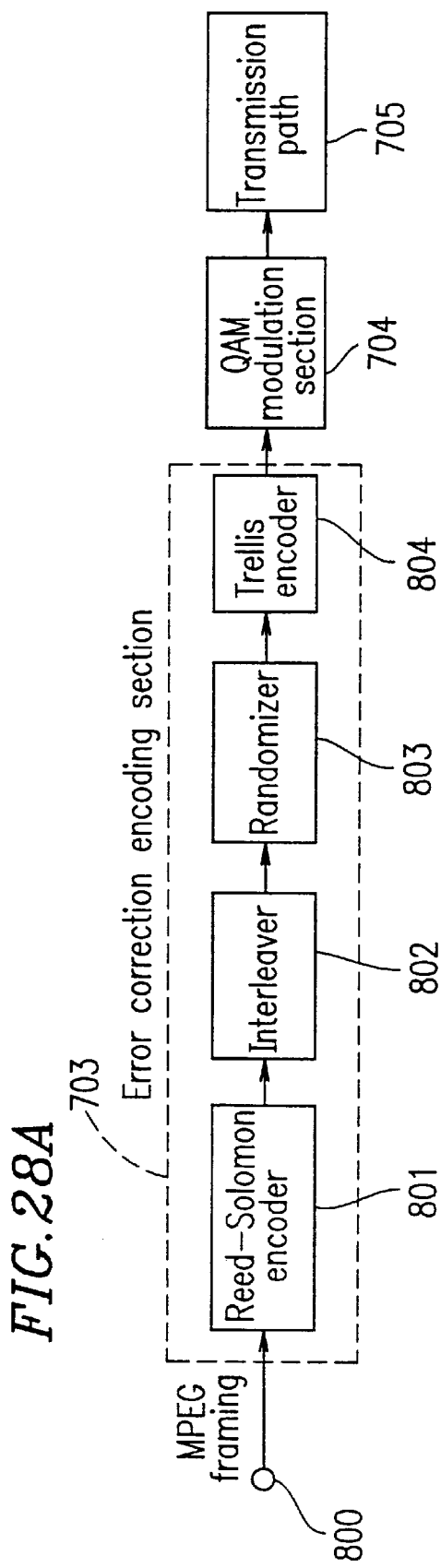
FIG. 28A is a block diagram illustrating an error correction encoding section provided in the transmitter of FIG. 27.
Figure 28B:
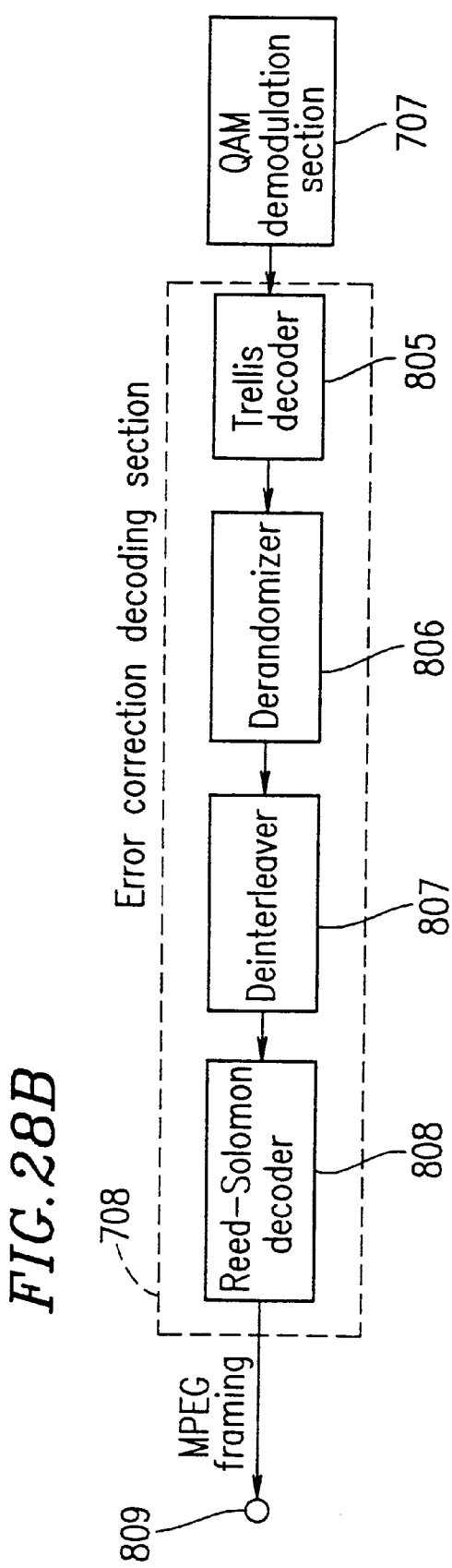
FIG. 28B is a block diagram illustrating an error correction decoding section provided in the receiver of FIG. 27.
Figure 34:
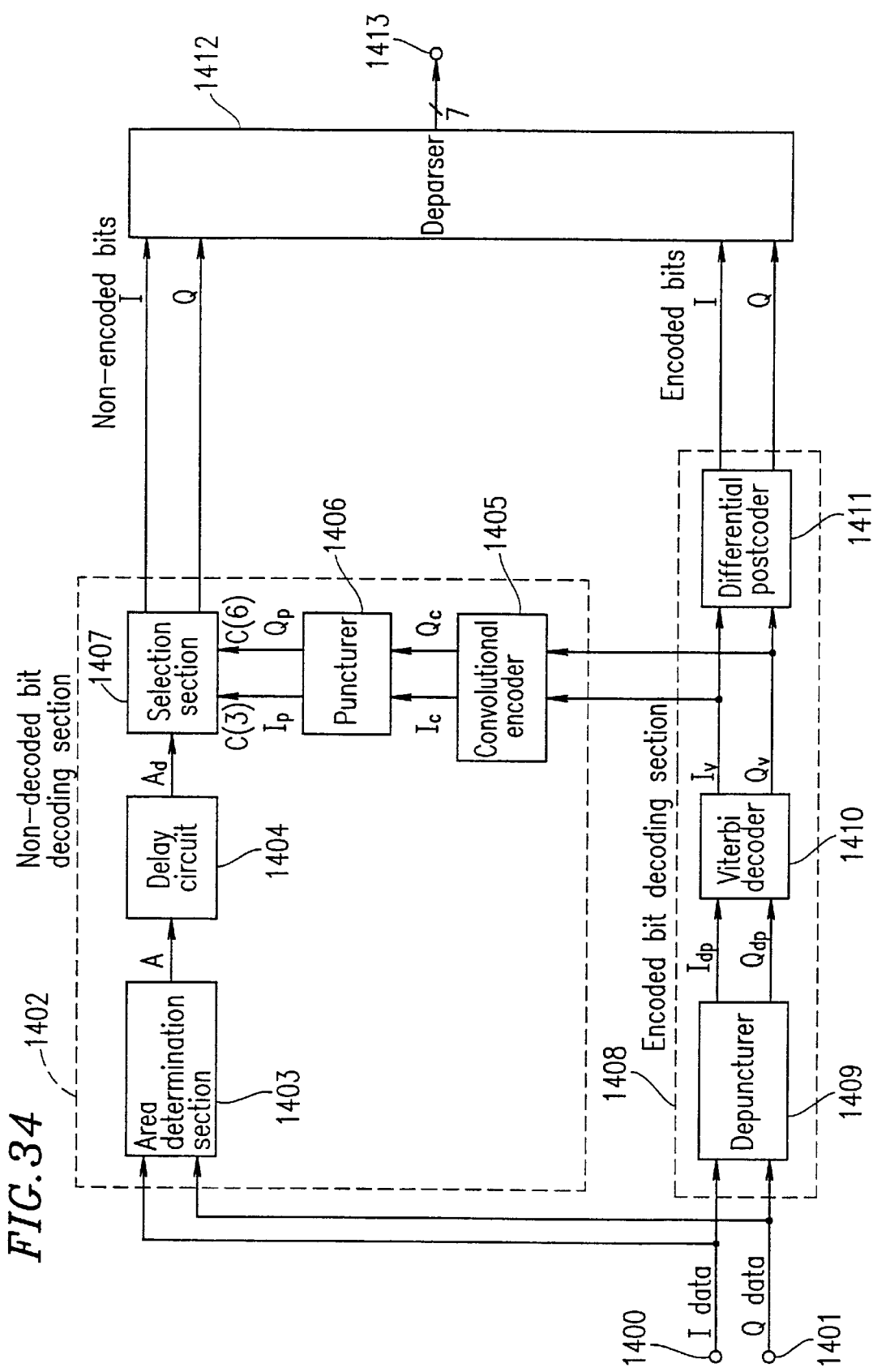
FIG. 34 is a block diagram illustrating a trellis decoder and a deparser.

FIG. 16 Is a block diagram illustrating a trellis decoder and a deparser of an error correction circuit according to Embodiment 2 of the present invention. The trellis decoder and the deparser of Embodiment 2 are provided in place of the trellis decoder and the deparser illustrated in FIG. 34, and in place of the trellis decoder 805 illustrated in FIG. 28B.

Referring to FIG. 16, there are provided terminals 2100, 2101 and 2110, an encoded bit decoding section 2102, a depuncturer 2103, a Viterbi decoder 2104, a differential postcoder 2105, a non-encoded bit decoding section 2106, a 4/5 puncturer 2107, a QAM demapper 2108, and a deparser 2109.

The trellis decoder comprises the non-encoded bit decoding section 2106 and the encoded bit decoding section 2102.

The encoded bit decoding section 2102 receives QAM-demodulated I data and Q data through the terminals 2100 and 2101, respectively. The depuncturer 2103 depunctures the I data and Q data. The Viterbi decoder 2104 performs a Viterbi decoding operation on the depunctured I data $I_{dp}$ and Q data $Q_{dp}$, and produces Viterbi-decoded I data $I_{v1}$ and Q data $Q_{v1}$, and I data $I_{v2}$ and Q data $Q_{v2}$ to be used for decoding the non-encoded bits. The differential postcoder 2105 performs a differential decoding operation on the encoded bits based on the Viterbi-decoded I data $I_{v1}$ and Q data $Q_{v1}$.

The Viterbi decoder 2104 inputs the Viterbi-decoded I data $I_{v2}$ (I data denotes a signal level) and Q data $Q_{v2}$ (Q data denotes a signal level) to the 4/5 puncturer 2107 in the non-encoded bit decoding section 2106. The 4/5 puncturer 2107 performs a puncturing operation at a code rate of 4/5 on the Viterbi-decoded I data 192 (I data denotes a signal level) and Q data $Q_{v2}$ (Q data denotes a signal level). The QAM demapper 2108 demaps the punctured I data $I_p$ (I data denotes a signal level) and Q data $Q_p$ (Q data denotes a signal level) so as to produce and output non-encoded bits.

The encoded and non-encoded bits which have been decoded as described above are input to the deparser 2109. The deparser 2109 puts together the I bits and the C bits, respectively, so as to output them through the terminal 2110 as I symbols and Q symbols.

Figure 17:
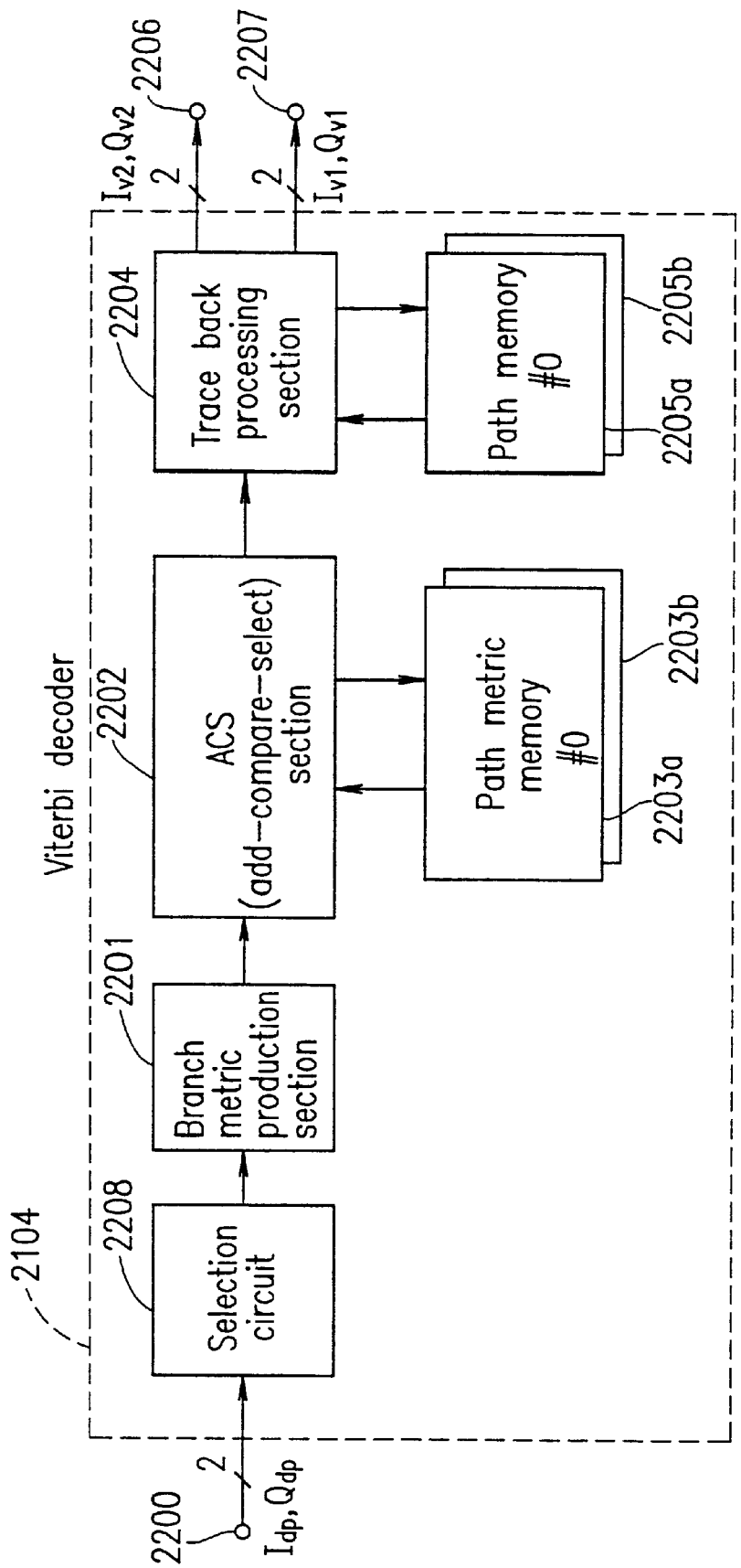
FIG. 17 is a block diagram illustrating a Viterbi decoder provided in the encoded bit decoding section of FIG. 16.

FIG. 17 is a block diagram illustrating the Viterbi decoder 2104 provided in the encoded bit decoding section 2102 of FIG. 16.

Referring to FIG. 17, the Viterbi decoder 2104 comprises terminals 2200, 2206 and 2207, a selection circuit 2208, a branch metric production section 2201, an ACS (Add Compare Select) section 2202, path metric memories 2203a and 2203b, a trace back processing section 2204, and path memories 2205a and 2205b.

Figure 18:
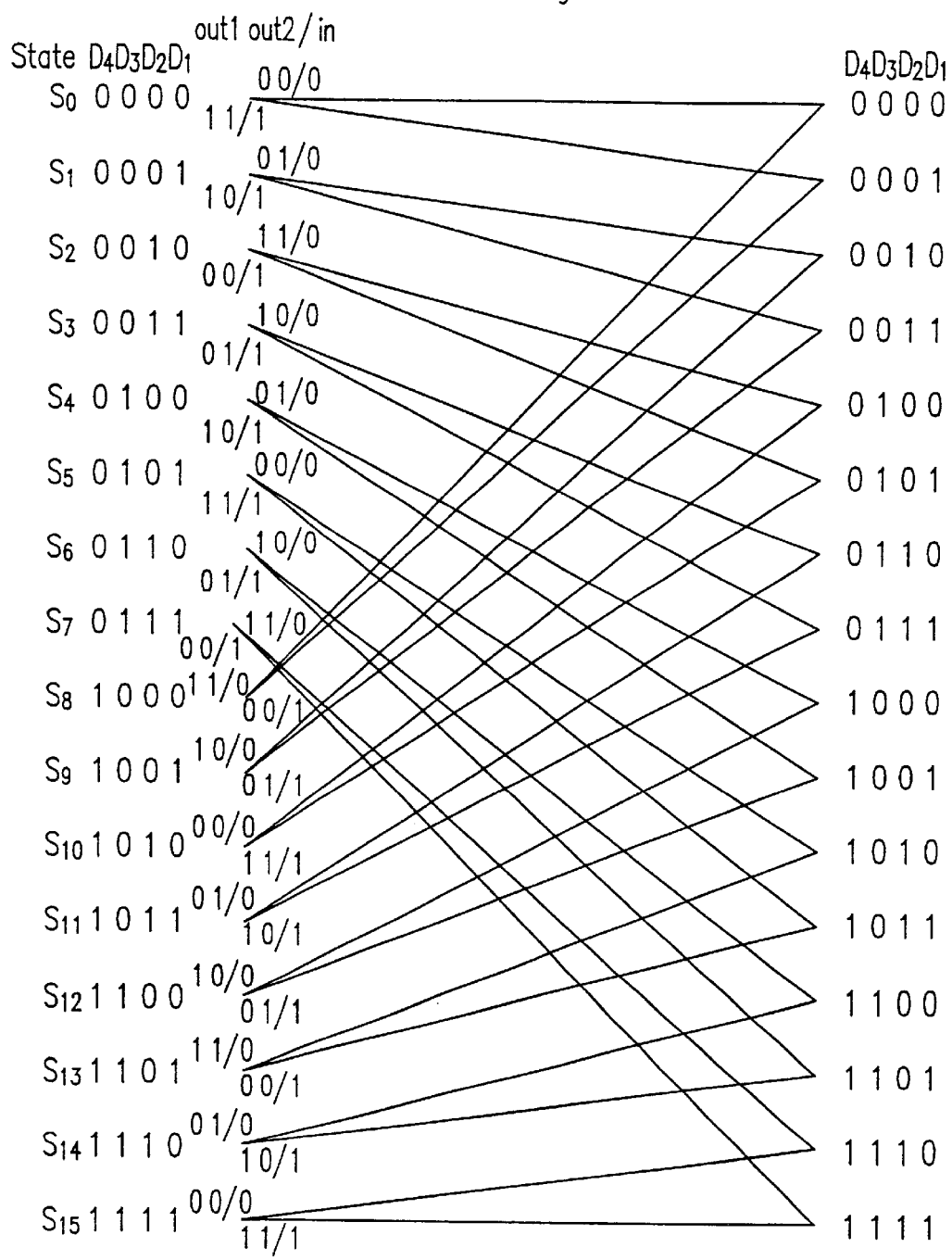
FIG. 18A illustrates a state transition diagram according to Embodiment 2 of the present invention.
FIG. 18B is a table illustrating the relationship between out1, out2 and the signal level according to the present invention.
Figure 32:
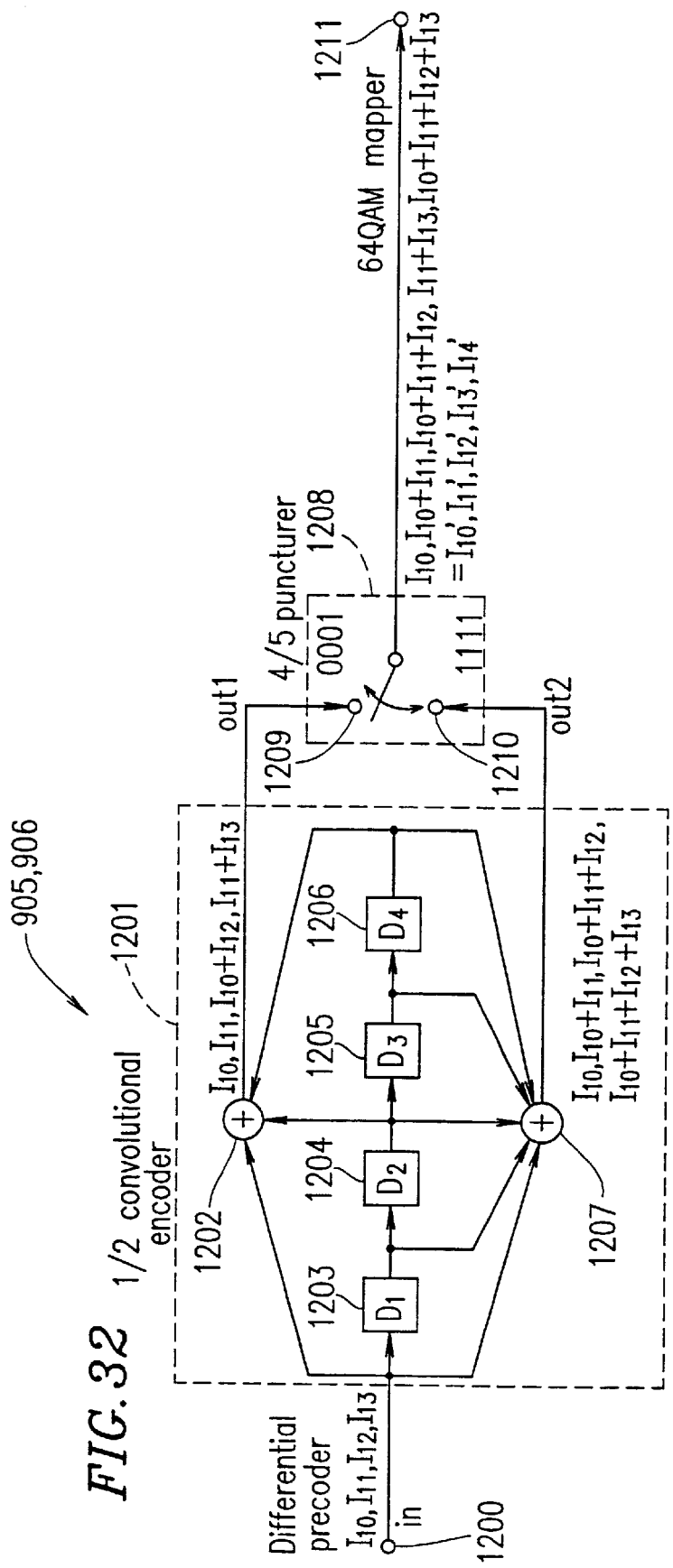
FIG. 32 is a block diagram illustrating a 1/2 convolutional encoder and 4/5 puncturer of FIG. 29.
Figure 33:
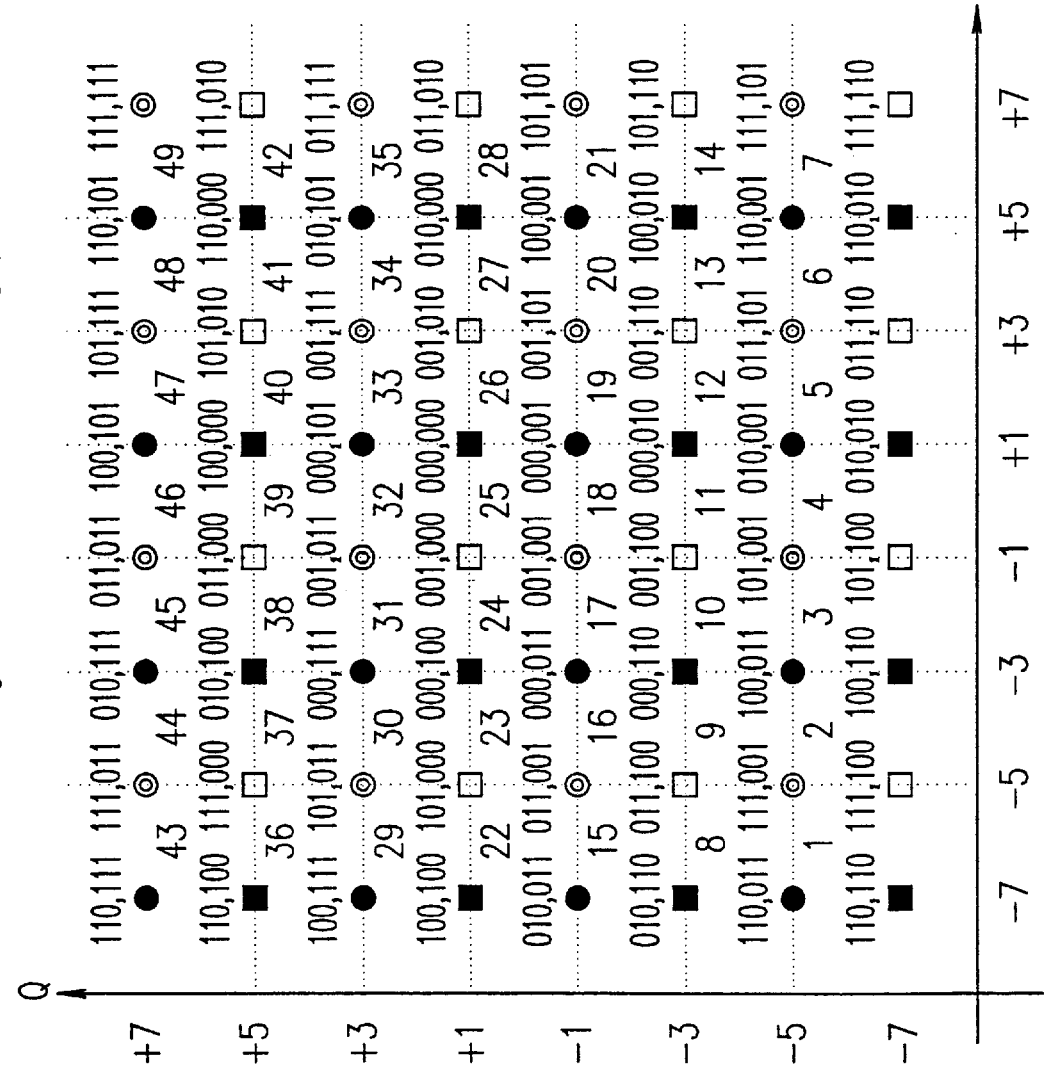
FIG. 33A illustrates an arrangement of 64QAM encoding points in the OAM mapper of FIG. 29.
FIG. 33B illustrates an encoding point in the CAM mapper of FIG. 29.
FIG. 33C is a chart illustrating encoded bits C(3) and C(6) in the CAM mapper of FIG. 29.

FIG. 18A is a state transition diagram. In the state transition diagram, $S_0$–$S_{15}$ each denote a state, $D_4$, $D_3$, $D_2$ and $D_1$ each denote delayed information of the respective delay circuits 1203–1206 (illustrated in FIG. 32) of the trellis encoder 804 in the error correction encoding section 703 (illustrated in FIG. 28A), and "out1 out2/in" denotes outputs 1,2/input of the 1/2 convolutional encoder 1201 illustrated in FIG. 32. The Viterbi decoder 2104 produces data $I_{v1}$, $Q_{v1}$, $I_{v2}$, $Q_{v2}$ using the state transition diagram illustrated In FIG. 18A.

An operation of the Viterbi decoder 2104 for decoding data using the state transition diagram and the Viterbi algorithm of FIGS. 18A and 18B will be described.

Referring to FIG. 17, the depunctured I data $I_{dp}$ or Q data $Q_{dp}$ is input through the terminal 2200. Each transition from one state to another has two branches. The selection circuit 2208 compares the encoded data with possible data points taken by each of the branches, and selects one of the data points which is closest to the encoded data. The branch metric production section 2201 calculates the branch metric for the closest data point, and outputs it to the ACS section 2202.

A square of Euclidean distance is used for the branch metric. However, a branch metric corresponding to punctured data of out1 is not calculated.

There are two possible transitions to the next state (from two different states), and the ACS section 2202 adds the branch metric for each branch to a path metric for each state stored in the path metric memory 2203a or 2203b, and selects the smaller one of the obtained sums to be used as a new path metric for the state. The new path metric for the state is stored in the same one of the path metric memories 2203a and 2203b. Data corresponding to the new path metric for each state is stored in one of the path memories 2205a and 2205b having a number corresponding to that of the path metric memory.

The data stored in the path memory 2205a or 2205b includes the delayed information ("0" or "1") of $D_4$ on the transition origin side of FIG. 18A ("$D_4$" on the left side in FIG. 18A), and the signal levels respectively corresponding to out1 and out2 (i.e., one of "−7, −3, +1, +5" when out1 or out2 is "0", or one of "−5, −1, +3, +7" when out1 or out2 is "1". However, the punctured data of out1 (i.e., the signal level corresponding to out1) is not stored in the path memory.

The trace back processing section 2204 traces back a predetermined cut-off path length along the surviving path which contains the state whose new path metric is smallest so as to determine data $I_{v1}$, $Q_{v1}$, $I_{v2}$, $Q_{v2}$ and outputs the data $I_{v2}$ and $Q_{v2}$ through the terminal 2206 and the data $I_{v1}$ and $Q_{v1}$ through the terminal 2207.

Figure 19:
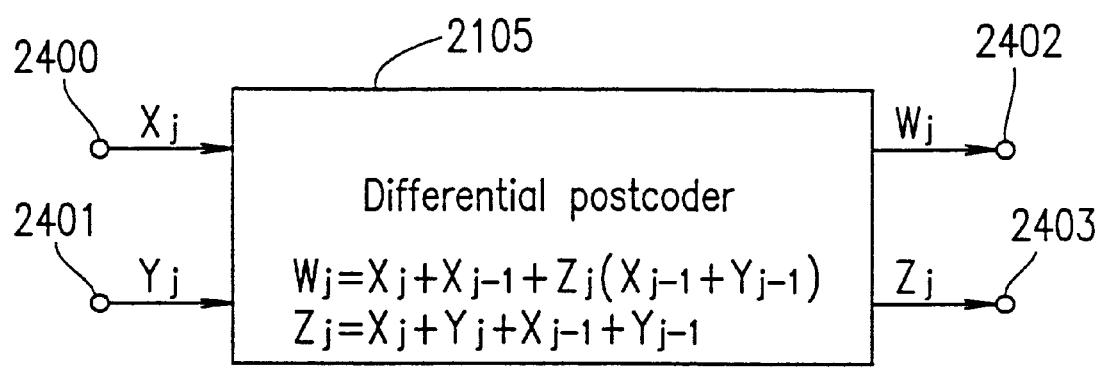
FIG. 19 illustrates a differential postcoder of FIG. 16.

FIG. 19 illustrates in greater detail the postcoder 2105 of FIG. 16. Referring to FIG. 19, the postcoder 2105 comprises terminals 2400, 2401, 2401 and 2403.

The I data $I_{v1}$ (=$X_1$) from the Viterbi decoder 2104 is input through the terminal 2400, and the Q data $Q_{v1}$ (=$Y_j$) from the Viterbi decoder 2104 is input through the terminal 2401. The differential postcoder 2305 performs a differential decoding operation on the I data and Q data based on the following differential encoding formulas (3) and (4) (where j is an integer), and outputs the differential-encoded data $W_j$ and $Z_j$ through the terminals 2402 and 2403, respectively.

$$W_j = X_j + X_j + X_{j-1} + Z_j(X_{j-1} + Y_{j-1}) \quad (3)$$

$$Z_j = X_j + Y_j + X_{j-1} + Y_{j-1} \quad (4)$$

As described above, Embodiment 2 of the present invention provides a Viterbi decoder for decoding a first series of data obtained by decoding a series of encoded data, and a second series of data obtained by decoding a series of data which contains information of a series of unencoded data. Thus, it is possible to decode the series of unencoded data (non-encoded bits) without convolutional-encoding (re-encoding) the series of Viterbi-decoded data.

(Embodiment 3)

Figure 20:
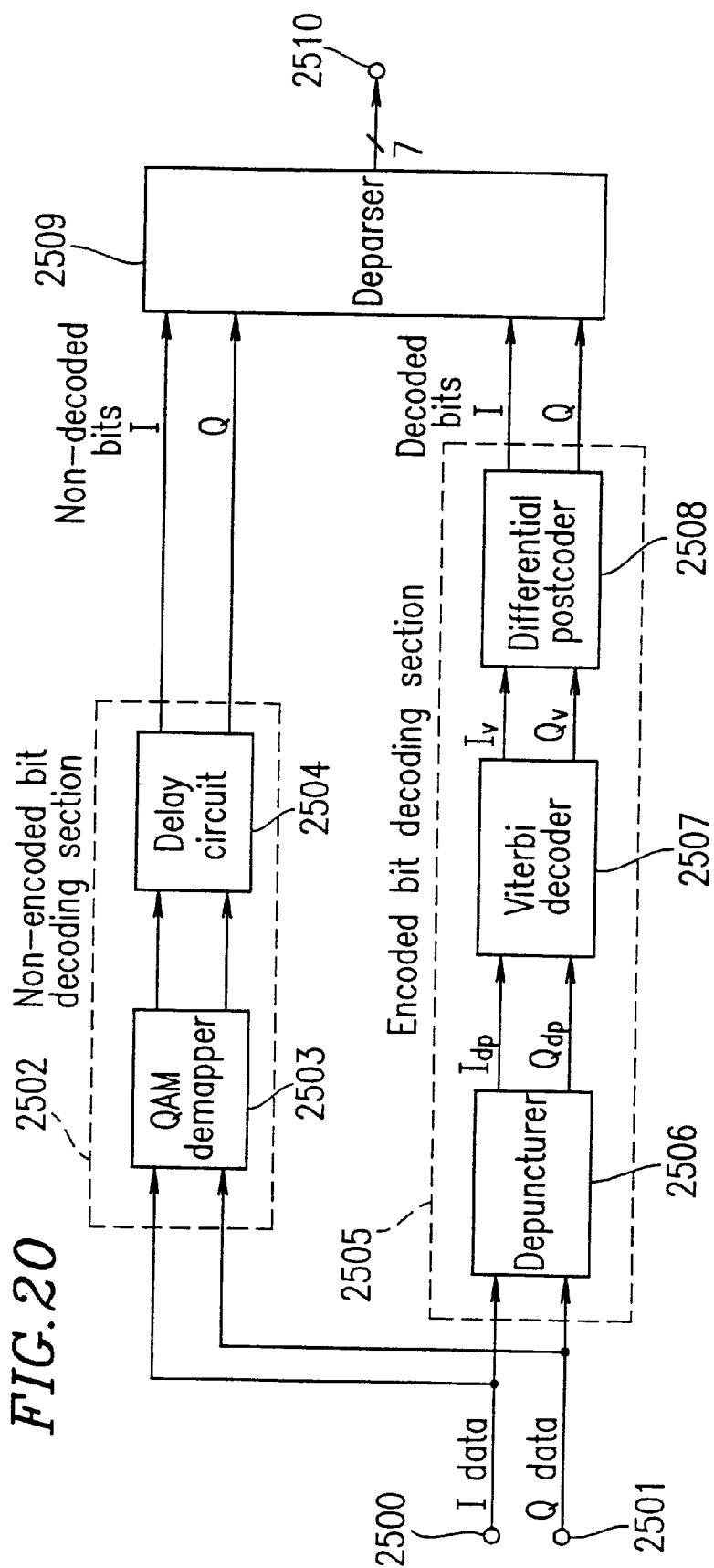
FIG. 20 is a block diagram illustrating a trellis decoder and a deparser according to Embodiment 2 of the present invention.

FIG. 20 is a block diagram illustrating a trellis decoder and a deparser of an error correction circuit according to Embodiment 3 of the present invention. The trellis decoder and the deparser of Embodiment 3 are provided in place of the trellis decoder and the deparser illustrated in FIG. 19, and in place of the trellis decoder 805 illustrated in FIG. 28B.

Referring to FIG. 20, there are provided terminals 2500, 2501 and 2510, an encoded bit decoding section 2505, a depuncturer 2506, a viterbi decoder 2507, a differential postcoder 2508, a non-encoded bit decoding section 2502, a QAM demapper 2503, a delay circuit 2504, and a deparser 2509.

The trellis decoder comprises the non-encoded bit decoding section 2502 and the encoded bit decoding section 2505.

The encoded bit decoding section 2505 receives QAM-demodulated I data and Q data through the terminals 2500 and 2501, respectively. The depuncturer 2506 depunctures the I data and Q data, The Viterbi decoder 2507 performs a Viterbi decoding operation on the depunctured I data $I_{dp}$ and Q data $Q_{dp}$, and produces Viterbi-decoded I data $I_v$ and Q data $Q_v$. The differential postcoder 2508 performs a differential decoding operation on the Viterbi-decoded I data $I_v$ and Q data $Q_v$, and produces encoded bits.

The non-encoded bit decoding section 2502 receives the QAM-demodulated I data and Q data at the QAM demapper 2503. The QAM demapper 2503 performs a demapping operation based on the I data and Q data, and produces non-encoded bits. The delay circuit 2504 delays the decoded non-encoded bits.

The encoded and non-encoded bits which have been decoded as described above are input to the deparser 2509. The deparser 2509 puts together the I bits and the Q bits, respectively, so as to output them through the terminal 2510 as I symbols and Q symbols.

FIGS. 21A–21C illustrate an arrangement of 64QAM encoding points in the QAM demapper 2503 of FIG. 20.

Figure 29:
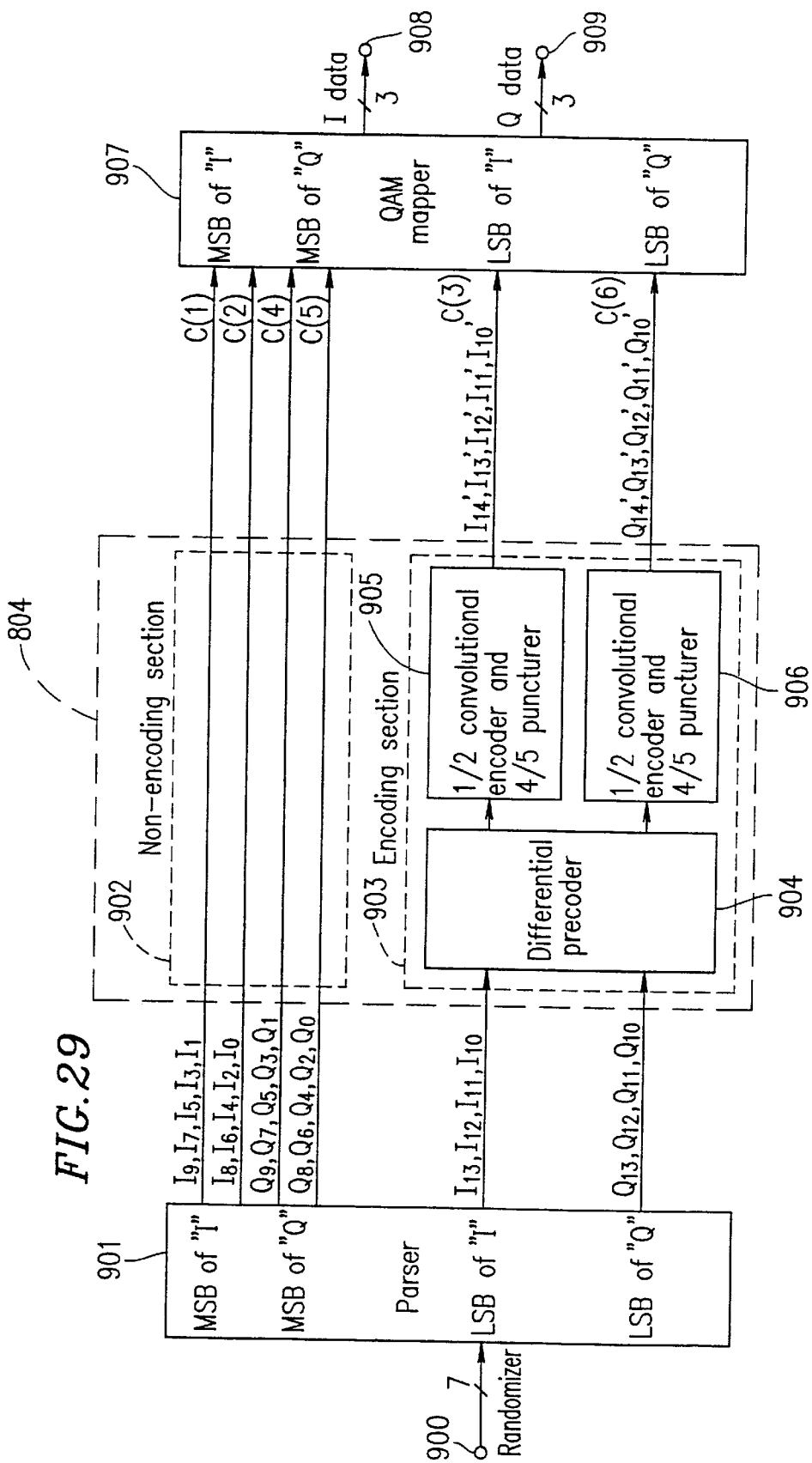
FIG. 29 is a block diagram illustrating a parser, a trellis encoder, and a QAM mapper provided in the error correction encoding section of FIG. 28A.
Figure 30:
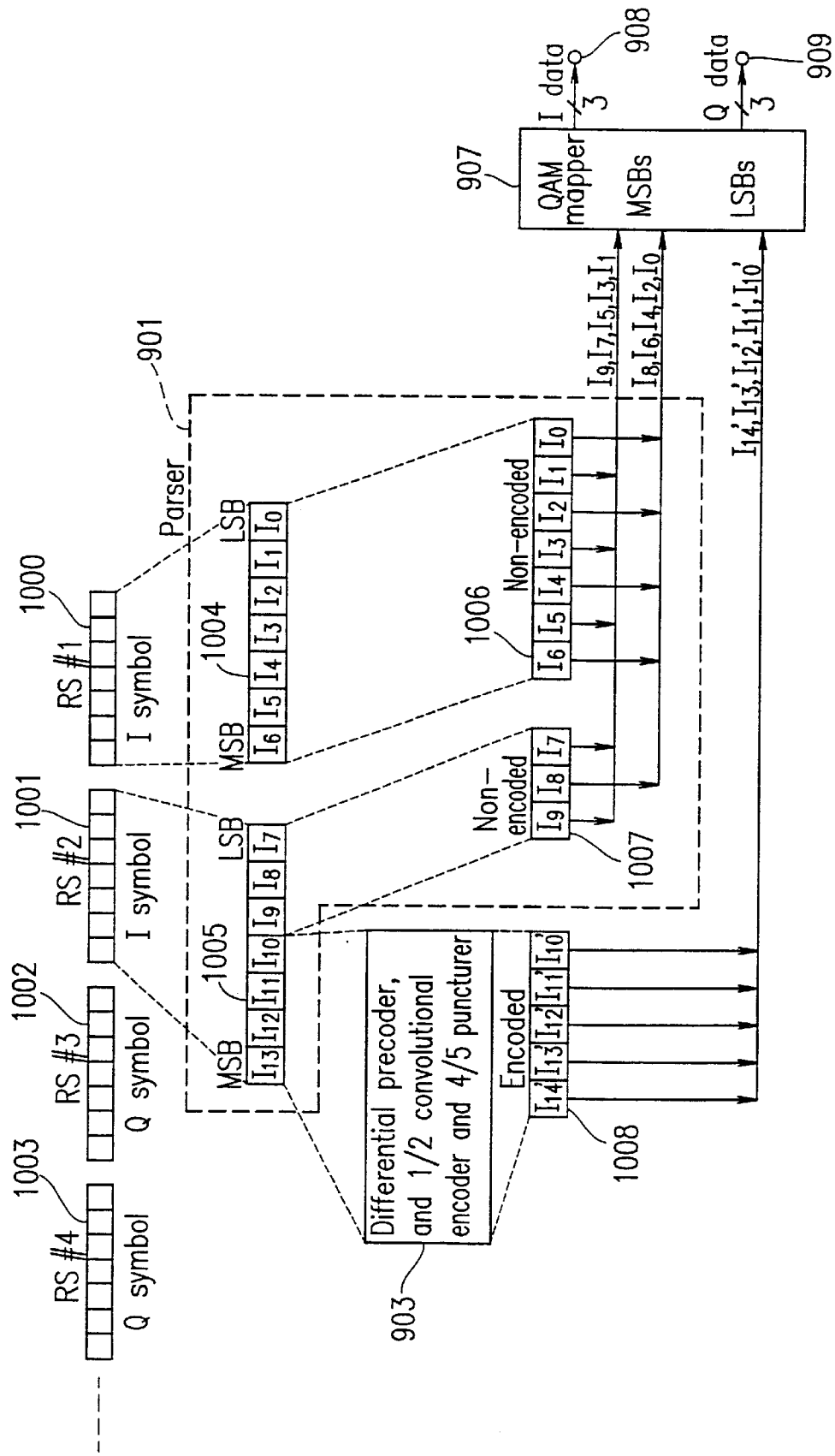
FIG. 30 illustrates an operation of the parser of FIG. 29.
Figure 31:
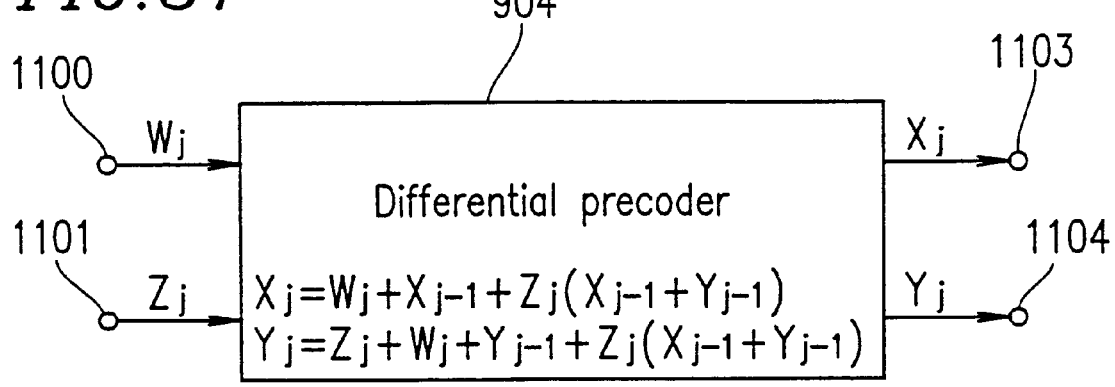
FIG. 31 illustrates a differential precoder of FIG. 29.

In the QAM demapper 2503, the 64QAM encoding points are arranged as illustrated in FIG. 21A, and the non-encoded bits corresponding to the Q data along the vertical axis thereof and the I data along the horizontal axis thereof are derived. As illustrated in FIG. 21B, each encoding point is represented as (I bit, Q bit)=(C(1) C(2) C(3), C(4) C(S) C(6)). C(1) C(2) C(4) and C(5) are non-encoded bits, and C(3) and C(6) are encoded bits (see FIG. 29). As illustrated in FIG. 21C, there are four combinations 5 (indicated respectively by the symbols "●", "■", "□", "⊙") of the encoded bits C(3) and C(6), each of which can be either "1" or " ". The bit being "0" corresponds to signal levels "−7, −3, +1, +5", and the bit being "1" corresponds to signal levels "−5, −1, +3, +7". I bits and Q bits respectively corresponding to the I data and the Q data are obtained with reference to the arrangement of 64QAM encoding points of FIG. 21A. Non-encoded bits are extracted from the I bits and the Q bits, and output.

As described above, Embodiment 3 of the present invention provides a demapper for decoding a series of demodulated data to obtain a series of unencoded data. Thus, it is possible to decode the series of unencoded data (non-encoded bits) without convolutional-encoding (re-encoding) the series of Viterbi-decoded data.

In Embodiments 2 and 3 above, a trace back processing section is used as a Viterbi decoder. Alternatively, a register exchange processing section may be used in place of the trace back processing section.

Moreover, while a square of Euclidean distance is used in Embodiment 3 for the branch metric, any other suitable value can alternatively be used, e.g., an absolute value of Euclidean distance. Furthermore, while the branch metric production section described above does not calculate a branch metric corresponding to punctured data of out1, the branch metric corresponding to punctured data of out1 may be a constant (e.g., 1).

Moreover, while decoding operations for the 64QAM system are described above, similar decoding operations can be performed for other systems, e.g., the 256QAM system.

Furthermore, both the differential encoding/decoding operations and the puncturing/depuncturing operations are performed in the above-described embodiments. However, either one, or both, of the differential encoding/decoding operations and the puncturing/depuncturing operations may be omitted, while it is still possible to perform the encoding and decoding operations which are substantially the same as those of Embodiments 2 and 3 based on the present invention. The present invention can be effectively used as long as trellis encoding and mapping onto 2-dimensional m values are performed on the transmitting side, while maximum likelihood decoding and demapping are performed on the receiving side.

As described above, Embodiments 2 and 3 provide: a Viterbi decoder for decoding a first series of data obtained by decoding a series of encoded data, and a second series of data obtained by decoding a series of data which contains information of a series of unencoded data: or a demapper for decoding a series of modulated data to obtain a series of unencoded data. Thus, it is possible to Implement an error correction circuit capable of decoding a series of unencoded data (non-encoded bits) without convolutional-encoding (re-encoding) a series of Viterbi-decoded data.

As is apparent from the detailed description of the embodiments of the present invention, the present invention can be used with trellis-encoded signals including encoded data and unencoded data. The present invention performs a Viterbi decoding operation by selecting one of a plurality of parallel paths of a branch through calculation of the branch metric thereof, thereby eliminating the need to decode non-encoded bits by re-convolutional-encoding the Viterbi-decoded data as in the prior art. Therefore, the present invention simplifies the circuit to be used, as compared to a circuit used with the conventional method in which the encoded lower bit is Viterbi-decoded, and a re-convolution is performed to decode the unencoded upper bit. Moreover, in the prior art, the re-convolution operation by a re-convolutional encoder may result in error propagation corresponding to the constraint length of the re-convolutional encoder, whereas substantially no error propagation occurs in the method of the present invention. Thus, characteristics such as the S/N ratio are better than those obtained with the conventional method.

In the terrestrial digital broadcasting system currently used in the U.S., the transition state of the convolutional encoder may change from 4-state transition to 8-state transition when a comb filter for removing an NTSC co-channel interference component Is provided on the receiving side. According to the present invention, one state resulting from the comb filter is associated with an increase in one parallel path, so that a decoder can be used commonly for 8-state transition and for 4-state transition, thereby simplifying the circuit.

Moreover, according to the present invention, even when a plurality of convolutional encoders are provided on the transmitting side, the data processing can be performed with a single Viterbi decoder on the receiving side by providing one circuit that can be used as both a branch metric production circuit and an ACS circuit, thereby reducing the circuit scale.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An error correction method for receiving q-bit data having convolutional-encoded bits and unencoded bits as a trellis-encoded signal and for decoding the trellis-encoded signal according to a predetermined algorithm represented by a state transition diagram, the convolutional-encoded bits being obtained by convolutional-encoding lower t bits of an input p-bit data (where p>=2, q>p, and p>t>=1) by a convolutional-encoder having c internal states and the unencoded bits being upper (p-t) bits of the input p-bit data, wherein the state transition diagram has branches for respective transitions from c internal states at time i to c internal states at time (i+1), and each of c internal states at time i has a transition to two different internal states at time i+1, each branch including n parallel paths, the error correction method comprising the steps of:
calculating a branch metric for each of the n parallel paths included in each branch, based on a level of the received trellis-encoded signal;
selecting one of the n parallel paths for each branch, based on the branch metrics calculated for the n parallel paths of each branch;
determining the branch metric calculated for the selected parallel path for each branch, as a branch metric for each branch;
storing, into each branch, a candidate of a decoded value of the upper (p-t) bits corresponding to the selected parallel path for each branch;
calculating a path metric for each of a plurality of paths, based on the determined branch metric for each branch, each of the plurality of paths representing state transitions from time (j-k) to time j;
selecting one of the plurality of paths based on path metrics calculated for the plurality of paths;
specifying a branch at each time from time (j-k) to time j in the selected path; and
outputting the stored candidate of the decoded value of the upper (p-t) bits for the specified branch as a decoded value of the upper (p-t) bits together with a decoded value of the lower t bits based on the specified branch.

2. An error correction method according to claim 1, wherein c is equal to 4.

3. An error correction method according to claim 2, wherein n is equal to 2.

4. An error correction method according to claim 2, wherein n is equal to 3.

5. An error correction method according to claim 1, wherein p is equal to 2, and t is equal to 1.

6. An error correction method according to claim 5, wherein n is equal to 2, and q is equal to 3.

7. An error correction method according to claim 5, wherein c is equal to 3, and q is equal to 4.

8. An error correction method for receiving q-bit data having convolutional-encoded bits and unencoded bits as a trellis-encoded signal and for decoding the trellis-encoded signal according to a predetermined algorithm represented by a state transition diagram, the convolutional-encoded bits being obtained by convolutional-encoding lower t bits of an input p-bit data (where p>=2, q>p, and p>t>=1) by a convolutional-encoder having c internal states and the unencoded bits being upper (p-t) bits of the input p-bit data, wherein the state transition diagram has branches for respective transitions from c internal states at time i to c internal states at time (i+1), and each of c internal states at time has a transition to two different internal states at time i+1, each branch including n parallel paths when the trellis-encoded signal is received as a signal decoded by a decoder having c internal states, and has m parallel paths (m>n) when the trellis-encoded signal is received as a signal decoded by a decoder having d internal states (d>c), the error correction method comprising the steps of:
calculating a branch metric for each of the parallel paths included in each branch, based on a level of the received trellis-encoded signal;
selecting one of the parallel paths for each branch, based on the branch metrics calculated for the parallel paths of each branch;
determining the branch metric calculated for the selected parallel path for each branch, as a branch metric for each branch;
calculating a path metric for each of a plurality of paths, based on the determined branch metric for each branch, each of the plurality of paths representing state transitions from time (j-k) to time j;
selecting one of the plurality of paths based on path metrics calculated for the plurality of paths; and
decoding the trellis-encoded signal based on the selected path.

9. An error correction method according to claim 8, further comprising the steps of:
storing, into each branch, a candidate of a decoded value of the upper (p-t) bits corresponding to the selected parallel path for each branch,
wherein the step of decoding the trellis-encoded signal includes the steps of:
specifying a branch at each time from time (j-k) to time j in the selected path; and
outputting the stored candidate of the decoded value of the upper (p-t) bits for the specified branch as a decoded value of the upper (p-t) bits together with a decoded value of the lower t bits based on the specified branch.

10. An error correction method according to claim 8, wherein c is equal to 4, d is equal to 8, n is equal to 2, and m is equal to 3.

11. An error correction circuit for receiving q-bit data having convolutional-encoded bits and unencoded bits as a trellis-encoded signal and for decoding the trellis-encoded signal according to a predetermined algorithm represented by a state transition diagram, the convolutional-encoded bits being obtained by convolutional-encoding lower t bits of an input p-bit data (where p>=2, q>p, and p>t>=1) by a convolutional-encoder having c states and the unencoded bits being upper (p-t) of the input p-bit data, wherein the state transition diagram has branches for respective transitions from c internal states at time i to c internal states at time (i+1), and each of c internal states at time has a transition to two different internal states at time i+1, each branch including n parallel paths, the error correction circuit comprising:
means for calculating a branch metric for each of the n parallel paths included in each branch, based on a level of the received trellis-encoded signal;
means for selecting one of the n parallel paths for each branch, based on the branch metrics calculated for the n parallel paths of each branch;
means for determining the branch metric calculated for the selected parallel path for each branch, as a branch metric for each branch;

means for storing, into each branch, a candidate of a decoded value of the upper (p-t) bits corresponding to the selected parallel path for each branch;

means for calculating a path metric for each of a plurality of paths, based on the determined branch metric for each branch, each of the plurality of paths representing state transitions from time (j-k) to time j;

means for selecting one of the plurality of paths based on path metrics calculated for the plurality of paths;

means for specifying a branch at each time from time (j-k) to time j in the selected path; and means for outputting the stored candidate of the decoded value of the upper (p-t) bits for the specified branch as a decoded value of the upper (p-t) bits together with a decoded value of the lower t bits based on the specified branch.

12. An error correction circuit for receiving q-bit data having convolutional-encoded bits and unencoded bits as a trellis-encoded signal and for decoding the trellis-encoded signal according to a predetermined algorithm represented by a state transition diagram, the convolutional-encoded bits being obtained by convolutional-encoding lower t bits of an input p-bit data (where p>=2, q>p, and p>t>=1) by a convolutional-encoder having c internal states and the unencoded bits being upper (p-t) bits of the input p-bit data, wherein the state transition diagram has branches for respective transitions from c internal states at time i to c internal states at time (i+1), and each of the c internal states at time i has a transition to two different internal states at time i+1, each branch includes n parallel paths when the trellis-encoded signal is received a signal decoded by a decoder having c internal states, and has m parallel paths (m>n) when the trellis-encoded signal is received as a signal decoded by a decoder having d internal states (d>c), the error correction circuit comprising:

means for calculating a branch metric for each of the parallel paths included in each branch, based on a level of the received trellis-encoded signal;

means for selecting one of the parallel paths for each branch, based on the branch metrics calculated for the parallel paths of each branch;

means for determining the branch metric calculated for the selected parallel path for each branch, as a branch metric for each branch;

means for calculating a path metric for each of a plurality of paths, based on the determined branch metric for each branch, each of the plurality of paths representing state transitions from time (j-k) to time j;

means for selecting one of the plurality of paths based on path metrics calculated for the plurality of paths; and means for decoding the trellis-encoded signal based on the selected path.

* * * * *

UNITED STATES PATENT AND TRADEMARK OFFICE
CERTIFICATE OF CORRECTION

PATENT NO.     : 6,738,949 B2
DATED          : September 23, 2004
INVENTOR(S)    : Hiroyuki Senda, Akira Kisoda and Takehiro Kamada It is certified that error appears in the above-identified patent and that said Letters Patent is hereby corrected as shown below:

Column 27,
Line 66, please insert -- i -- after the word "time".

Column 28,
Line 55, please insert -- i -- after the word "time".

Signed and Sealed this

Twenty-sixth Day of October, 2004

JON W. DUDAS
*Director of the United States Patent and Trademark Office*